United States Patent
Liu et al.

(10) Patent No.: US 9,786,292 B2
(45) Date of Patent: Oct. 10, 2017

(54) AUDIO ENCODING APPARATUS, AUDIO DECODING APPARATUS, AUDIO ENCODING METHOD, AND AUDIO DECODING METHOD

(71) Applicant: PANASONIC CORPORATION, Osaka (JP)

(72) Inventors: Zongxian Liu, Singapore (SG); Masahiro Oshikiri, Kanagawa (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 205 days.

(21) Appl. No.: 14/350,382

(22) PCT Filed: Oct. 12, 2012

(86) PCT No.: PCT/JP2012/006542
§ 371 (c)(1),
(2) Date: Apr. 8, 2014

(87) PCT Pub. No.: WO2013/061531
PCT Pub. Date: May 2, 2013

(65) Prior Publication Data
US 2014/0249806 A1   Sep. 4, 2014

(30) Foreign Application Priority Data

Oct. 28, 2011  (JP) .................................. 2011-237820

(51) Int. Cl.
*G10L 19/038*  (2013.01)
*H03M 7/30*    (2006.01)
(Continued)

(52) U.S. Cl.
CPC ......... *G10L 19/038* (2013.01); *H03M 7/3082* (2013.01); *G10L 19/002* (2013.01); *G10L 2019/0001* (2013.01)

(58) Field of Classification Search
None
See application file for complete search history.

(56) References Cited

U.S. PATENT DOCUMENTS

2007/0016414 A1 *  1/2007  Mehrotra .............. G10L 19/038
                                                    704/230
2009/0240491 A1    9/2009  Reznik
(Continued)

FOREIGN PATENT DOCUMENTS

CN   WO 2011063694 A1 *  6/2011   ........... G10L 19/002
JP   2007-171519           7/2007
WO   2011/063694           6/2011

OTHER PUBLICATIONS

Search report from E.P.O., dated Apr. 9, 2015.
(Continued)

*Primary Examiner* — Marivelisse Santiago Cordero
*Assistant Examiner* — Keara Harris
(74) *Attorney, Agent, or Firm* — Greenblum & Bernstein, P.L.C.

(57) ABSTRACT

An audio encoding apparatus capable of reducing the bit rate even if a codebook having a larger codebook number is selected in a split multi-rate lattice vector quantization is provided. Sub-vector determining unit (121) determines, in the spectrum of an input signal having been divided into a predetermined number of sub-vectors, a sub-vector using the largest number of bits. Positional information encoding unit (122) encodes the positional information of the determined sub-vector. Codebook indication value estimating unit (124) estimates a number of used bits for a codebook indication value of the largest number of used bits by use of the (N−1)

(Continued)

other codebook indication values, and generates a number-of-used-bits estimation value. Difference calculating unit (125) calculates a difference by subtracting the number-of-used-bits estimation value from the actual value of the codebook indication value of the largest number of used bits. Difference encoding unit (126) encodes the difference information.

13 Claims, 27 Drawing Sheets

(51) Int. Cl.
    *G10L 19/002*      (2013.01)
    *G10L 19/00*      (2013.01)

(56) References Cited

U.S. PATENT DOCUMENTS

| | | | |
|---|---|---|---|
| 2012/0226505 A1* | 9/2012 | Lin | G10L 19/002 704/500 |
| 2012/0232913 A1* | 9/2012 | Terriberry | G10L 19/038 704/503 |

OTHER PUBLICATIONS

Brandenburg, "MP3 and AAC Explained", AES 17th International Conference on High Quality Audio Coding, 1999.
Lefevre et al., "High Quality Coding of Wideband Audio Signals Using Transform Coded Excitation (TCX)", IEEE, 1994.
Itu, Study Group 16, "G.729-based Embedded Variable Bit-rate Coder: An 8-32 kbit/s Scalable Wideband Coder Bitstream Interoperable With G.729: Extension of the G.729.1 Low-delay Mode Functionality to 14 kbit/s, and Corrections to the Main Body and Annex B", ITU-T Rec. G.729.1 , 2007.
Vaillancourt et al., "ITU-T EV-VBR: A Robust 8-32 kbit/s Scalable Coder for Error Prone Telecommunications Channels," 2008.
Xie et al., "Embedded Algebraic Vector Quantizers (EAVQ) With Application to Wideband Speech Coding", IEEE, 1996.
3rd Generation Partnership Project, "Extended Adaptive Multi-Rate—Wideband (AMR-WB+) Codec", 3GPP TS 26.290 V11.0.0, Sep. 2012.
Ragot et al., "Low-Complexity Multi-Rate Lattice Vector Quantization With Application to Wideband TCX Speech Coding at 32 Kbits/S", ICASSP, May 17, 2004.
International Search Report in PCT/JP2012/006542, dated Nov. 13, 2012.

* cited by examiner

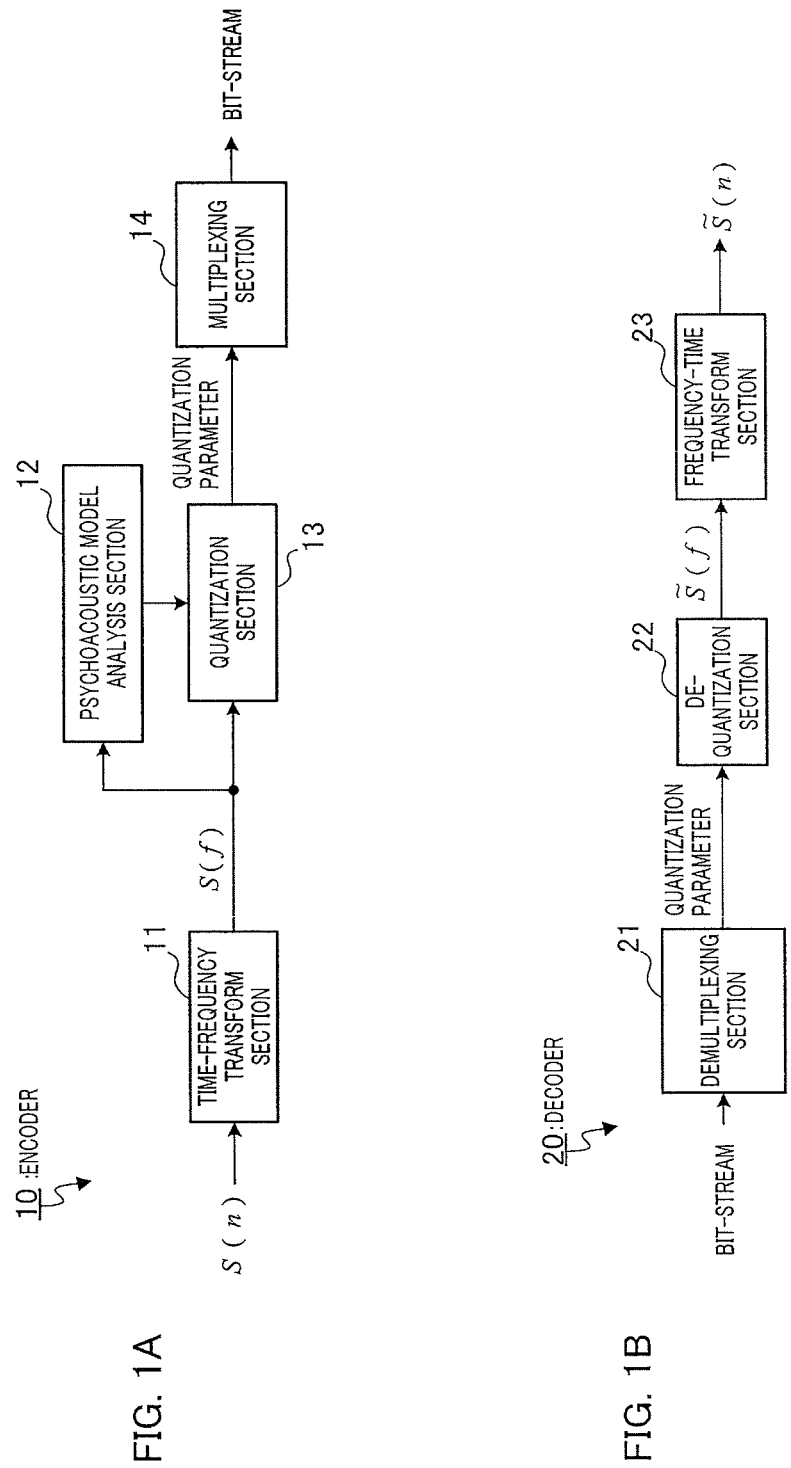

| CODEBOOK NUMBER | CODEBOOK | CODEBOOK INDICATION VALUE | NUMBER OF USED BITS OF CODEBOOK INDICATION VALUE | NUMBER OF USED BITS OF CODE VECTOR INDEX | TOTAL NUMBER OF USED BITS |
|---|---|---|---|---|---|
| 0 | Q0 | 0 | 1 | 0 | 1 |
| 2 | Q2 | 10 | 2 | 8 | 10 |
| 3 | Q3 | 110 | 3 | 12 | 15 |
| 4 | Q4 | 1110 | 4 | 16 | 20 |
| 5 | Q5 | 11110 | 5 | 20 | 25 |
| ... | ... | ... | ... | ... | ... |

FIG. 6

| SUB-VECTOR | v1 | v2 | v3 | v4 | v5 | v6 | v7 | v8 |
|---|---|---|---|---|---|---|---|---|
| CODEBOOK | Q2 | Q2 | Q11 | Q3 | Q2 | Q2 | Q2 | Q2 |
| NUMBER OF USED BITS OF CODEBOOK INDICATION VALUE | 2 | 2 | 11 | 3 | 2 | 2 | 2 | 2 |
| NUMBER OF USED BITS PER SUB-VECTOR | 10 | 10 | 55 | 15 | 10 | 10 | 10 | 10 |
| TOTAL NUMBER OF USED BITS | 130(2 bits left unused) | | | | | | | |

FIG. 10

| POSITION OF SUB-VECTOR | v1 | v2 | v3 | v4 | v5 | v6 | v7 | v8 |
|---|---|---|---|---|---|---|---|---|
| POSITION INFORMATION ENCODED CODE | 000 | 001 | 010 | 011 | 100 | 101 | 110 | 111 |

FIG. 13

| DIFFERENCE INFORMATION cbdiff | 0 | −1 | −2 | −3 | ..... |
|---|---|---|---|---|---|
| DIFFERENCE INFORMATION ENCODED CODE | 0 | 10 | 110 | 1110 | ..... |

FIG. 14

| SUB-VECTOR INDEX | v1 | v2 | v3 | v4 | v5 | v6 | v7 | v8 |
|---|---|---|---|---|---|---|---|---|
| CODEBOOK | Q2 | Q2 | Q11 | Q3 | Q2 | Q2 | Q2 | Q2 |
| CODEBOOK INDICATION VALUE | 10 | 10 | 11111111110 | 110 | 10 | 10 | 10 | 10 |

FIG. 17

AUDIO ENCODING APPARATUS, AUDIO DECODING APPARATUS, AUDIO ENCODING METHOD, AND AUDIO DECODING METHOD

TECHNICAL FIELD

The present invention relates to a speech encoding apparatus, a speech decoding apparatus, a speech encoding method and a speech decoding method using vector quantization.

BACKGROUND ART

For audio and speech coding, transform coding and linear predictive coding are two major coding methods. The transform coding and linear predictive coding will be described below.

(1) Transform Coding

Transform coding transforms a time domain signal into a spectral domain signal by using Discrete Fourier Transform (DFT), Modified Discrete Cosine Transform (MDCT) or the like, and quantizes and encodes individual spectral coefficients.

In quantization or coding processing, psychoacoustic model is generally applied to determine the perceptual importance of individual spectral coefficients, and the spectral coefficients are quantized or encoded according to their perceptual importance. Transform coding is effective for music or general audio signals. Examples of transform codec include MP3 (MPEG Audio Layer 3), AAC (Advanced Audio Coding) (see NPL 1), and Dolby AC3 (Audio Code number 3).

A simple configuration of a transform codec is illustrated in FIGS. 1A and 1B. In encoder 10 illustrated in FIG. 1A, time-frequency transform section 11 transforms time domain signal S(n) to frequency domain signal S(f) using a time-frequency transform method such as DFT or MDCT and outputs frequency domain signal S(f) to psychoacoustic model analysis section 12 and quantization section 13.

Psychoacoustic model analysis section 12 performs a psychoacoustic model analysis on frequency domain signal S(f) to obtain a masking curve.

Further, quantization section 13 quantizes frequency domain signal S(f) according to the masking curve in order to make the quantization noise inaudible.

The individual quantized parameters are multiplexed by multiplexing section 14 and sent as bit-stream information to the decoder side.

In decoder 20 illustrated in FIG. 1B, all the bit-stream information sent from the encoder side is demultiplexed by demultiplexing section 21. The demultiplexed quantized parameters are de-quantized by de-quantization section 22 and decoded into frequency domain signal S~(f). Although tildes (wavy symbols) "~" are added over symbols "S" in the accompanying drawings, tildes are added to the right side of symbols "S" in this description because of the limitations of notation. A tilde as used herein indicates a signal obtained as a result of decoding.

Decoded frequency domain signal S~(f) is transformed to time domain signal S~(n) by frequency-time transform section 23 using a frequency-time transform method such as Inverse Discrete Fourier Transform (IDFT) or Inverse Modified Discrete Cosine Transform (IMDCT).

(2) Linear Predictive Coding

Linear predictive coding utilizes the predictable nature of speech signals in time domain (the nature that speech signals are predictable in time domain) to obtain a residual signal (or an excitation signal) by applying linear prediction to an inputted speech signal. Especially for a speech signal in a speech range, this linear prediction model can very efficiently represent speech. After the linear prediction, the residual signal is encoded mainly by one of two different methods: TCX (Transform Coded eXcitation) and CELP (Code Excited Linear Prediction). TCX and CELP will be described below.

(2-1) TCX

In TCX (see NPL 2), a residual signal is encoded efficiently in the frequency domain. Examples of TCX codec include 3GPP AMR-WB+ (Extended Adaptive Multi-Rate Wideband) and MPEG USAC (Unified Speech and Audio Coding).

A simple configuration of a TCX codec is illustrated in FIGS. 2A and 2B. In encoder 30 illustrated in FIG. 2A, LPC analysis is performed on input signal S(n) by LPC analysis section 31 to utilize the predictable nature of signals in time domain.

The individual LPC parameters are quantized by quantization section 32, and quantization indexes are outputted to de-quantization section 33 and multiplexing section 37.

The quantization indexes are de-quantized by de-quantization section 33 to reconstruct the LPC parameters.

In addition, LPC inverse filtering using the reconstructed LPC parameters is applied to input signal S(n) by LPC inverse filter section 34, thereby obtaining time domain residual signal $S_r(n)$.

Time domain residual signal $S_r(n)$ is transformed to frequency domain residual signal $S_r(f)$ by time-frequency transform section 35 using the frequency-time transform method such as DFT or MDCT.

Frequency domain residual signal $S_r(f)$ is quantized by quantization section 36, and the individual quantized parameters are outputted to multiplexing section 37.

The quantization indexes outputted from quantization section 32 and the respective quantization parameters outputted from quantization section 36 are multiplexed by multiplexing section 37 and sent to the decoder side as bit-stream information.

In decoder 40 illustrated in FIG. 2B, all the bit-stream information sent from the encoder side is demultiplexed by demultiplexing section 41 into the quantization indexes and the quantization parameters. The demultiplexed quantization indexes are outputted to de-quantization section 44, and the demultiplexed quantization parameters are outputted to de-quantization section 42.

The demultiplexed quantization parameters are de-quantized by de-quantization section 42 and decoded into frequency domain residual signal $S\sim_r(f)$, and decoded frequency domain residual signal $S\sim_r(f)$ is transformed to time domain residual signal $S\sim_r(n)$ by frequency-time transform section 43 using a frequency-time transform method such as IDFT or IMDCT.

On the other hand, the demultiplexed quantization indexes are de-quantized by de-quantization section 44 to obtain the LPC parameters.

Time domain residual signal $S\sim_r(n)$ is processed using the LPC parameters by LPC synthesis filter section 45 to obtain time domain signal S~(n).

(2-2) CELP

In CELP, a residual signal is quantized using a prescribed codebook. To further enhance the speech quality, it is often that a difference signal between an original signal and a signal after LPC synthesis is transformed and encoded into frequency domain. Examples of CELP codec include ITU-T G.729.1 (see NPL 3) and ITU-T G.718 (see NPL 4).

A simple configuration of layer coding (or embedded coding) of CELP and transform coding is illustrated in FIGS. 3A and 3B. In encoder 50 illustrated in FIG. 3A, to utilize the predictable nature of signals in time domain, CELP encoding is performed on input signal S(n) by CELP encoding section 51, and CELP parameters are outputted to CELP local decoding section 52 and multiplexing section 55.

The CELP parameters are decoded by CELP local decoding section 52 to obtain synthesized signal $S_{syn}(n)$. Prediction error signal $S_e(n)$ is obtained by subtracting synthesized signal $S_{syn}(n)$ from input signal S(n).

Time domain prediction error signal $S_e(n)$ is transformed to frequency domain prediction error signal $S_e(f)$ by time-frequency transform section 53 using the frequency-time transform method such as DFT or MDCT.

Frequency domain prediction error signal $S_e(f)$ is quantized by quantization section 54, and respective quantization parameters are outputted to multiplexing section 55.

The CELP parameters outputted from CELP encoding section 51 and the respective quantization parameters outputted from quantization section 54 are multiplexed by multiplexing section 55 and sent as bit-stream information to the decoder side.

In decoder 60 illustrated in FIG. 3B, all the bit-stream information sent form the encoder side is demultiplexed by demultiplexing section 61 into the CELP parameters and the individual quantization parameters. The demultiplexed CELP parameters are outputted to CELP decoding section 64, and the demultiplexed quantization parameters are outputted to de-quantization section 62.

The demultiplexed quantization parameters are de-quantized by de-quantization section 62 and decoded into frequency domain prediction error signal $S\tilde{}_e(f)$, and decoded frequency domain prediction error signal $S\tilde{}_e(f)$ is transformed to time domain prediction error signal $S\tilde{}_e(n)$ by frequency-time transform section 63 using the frequency-time transform method such as IDFT or IMDCT.

On the other hand, the demultiplexed CELP parameters are decoded by CELP decoding section 64 to obtain synthesized signal $S_{syn}(n)$.

Time domain prediction error signal $S\tilde{}_e(n)$ is obtained by adding prediction error signal $S\tilde{}_e(n)$ and synthesized signal $S_{syn}(n)$.

(3) Split Multi-Rate Lattice Vector Quantization

Encoding in transform coding and linear prediction coding generally utilizes some kind of quantization methods. One of such quantization methods is split multi-rate lattice vector quantization (hereinafter referred to as "split multi-rate lattice VQ" as appropriate) (or algebraic vector quantization) (see NPL 5).

In AMR-WB+ (see NPL 6), split multi-rate lattice VQ is used to quantize an LPC residual in TCX domain. Also in a newly standardized speech codec ITU-T G.718, split multi-rate lattice VQ is used to quantize an LPC residual in MDCT domain as the third residue coding layer.

Split multi-rate lattice VQ is a vector quantization method based on lattice quantizers. Specifically, in the case of the split multi-rate lattice VQ used in AMR-WB+, spectrum is quantized in blocks of 8 spectral coefficients using vector codebooks including subsets of the Gosset lattice, referred to as RE8 lattice (see NPL 5).

All points of a given lattice can be generated from a so-called square generator matrix G of the lattice, as c=s·G (where s is a line vector with respective integer values and c is the generated lattice point).

To create a vector codebook at a certain rate, only lattice points inside an area (in 8 dimensions) of a given radius are taken. Therefore, multi-rate codebooks are created by taking subsets of lattice points inside areas of different radii.

A simple configuration using split multi-rate lattice VQ in a TCX codec is illustrated in FIGS. 4A and 4B. In encoder 70 illustrated in FIG. 4A, LPC analysis is performed on input signal S(n) by LPC analysis section 71 to utilize the predictable nature of signals in time domain.

The individual LPC parameters generated from the LPC analysis are quantized by quantization section 72, and quantization indexes are outputted to de-quantization section 73 and multiplexing section 77.

The quantization indexes are de-quantized by de-quantization section 73 to reconstruct the LPC parameters.

In addition, LPC inverse filtering using the reconstructed LPC parameters is applied to input signal S(n) by LPC inverse filter section 74, thereby obtaining residual signal $S_r(n)$.

Time domain residual signal $S_r(n)$ is transformed to frequency domain residual signal $S_r(f)$ by time-frequency transform section 75 using the frequency-time transform method such as DFT or MDCT.

Split multi-rate lattice VQ is applied to frequency domain residual signal $S_r(f)$ by split multi-rate lattice VQ section 76, and respective quantized parameters are outputted to multiplexing section 77.

The quantization indexes outputted from quantization section 72 and the respective quantization parameters outputted from split multi-rate lattice VQ section 76 are multiplexed by multiplexing section 77 and sent to the decoder side as bit-stream information.

In decoder 80 illustrated in FIG. 4B, all the bit-stream information sent from the encoder side is demultiplexed by demultiplexing section 81 into the quantization indexes and the quantization parameters.

Split multi-rate lattice inverse VQ is applied to the demultiplexed quantization parameters by split multi-rate lattice inverse VQ section 82 so that the parameters are decoded into frequency domain residual signal $S\tilde{}_r(f)$, and decoded frequency domain residual signal $S\tilde{}_r(f)$ is transformed to time domain residual signal $S\tilde{}_r(n)$ by frequency-time transform section 83 using the frequency-time transform method such as IDFT or IMDCT.

The demultiplexed quantization indexes are de-quantized by de-quantization section 84 to obtain the LPC parameters.

Time domain residual signal $S\tilde{}_r(n)$ is processed using the LPC parameters by LPC synthesis filter section 85 to obtain time domain signal $S\tilde{}(n)$.

FIG. 5 is a block diagram illustrating processing of split multi-rate lattice VQ. In FIG. 5, input spectrum S(f) is divided into some number of 8-dimensional blocks (or vectors) by block dividing section 91, and the divided 8-dimensional blocks are outputted to split multi-rate lattice VQ section 92.

Each of the divided 8-dimensional blocks is quantized by split multi-rate lattice VQ in split multi-rate lattice VQ section 92. In this quantization, first, a global gain is calculated according to the number of available bits and the energy level of the whole spectrum. Then, for each block, the ratio between the original spectrum and the global gain is obtained, and these ratios are quantized by different codebooks.

The obtained individual quantization parameters of split multi-rate lattice VQ are a quantization index of global gain, a codebook indication value for each block, and a code vector index for each block.

FIG. 6 is an overview of codebook list of split multi-rate lattice VQ adopted in AMR-WB+ (see NPL 6). In FIG. 6, codebook Q0, Q2, Q3 or Q4 is a base codebook. When a certain lattice point is not included in these base codebooks, Voronoi extension (see NPL 7) is applied using only Q3 or Q4 part of the base codebooks. For example, in the table, Q5 is Voronoi extension of Q3, and Q6 is Voronoi extension of Q4.

Each codebook consists of a certain number of code vectors, and a code vector index in the codebook is represented by a certain number of bits. This number of bits is obtained by equation 1 as follows:

$$N_{bits} = \log_2(N_{cv}) \quad \text{(Equation 1)}$$

In equation 1, $N_{bits}$ denotes the number of bits used to represent a code vector index, and $N_{cv}$ denotes the number of code vectors in a codebook.

In codebook Q0, there is only one vector, the null vector, which means that the quantized value of the vector is 0. Therefore, there are no bits required for the code vector index.

There are two possible methods for forming a bit-stream from a set of three quantization parameters generated by split multi-rate lattice VQ: a global gain's index, a codebook indication value, and a code vector's index. The first bit-stream forming method is illustrated in FIG. 7, and the second bit-stream forming method is illustrated in FIG. 8. A case where an input spectrum is divided into 6 blocks (v0 to v5) is illustrated here.

In the first bit-stream forming method, global gain G is quantized by a scalar quantizer (Q in FIG. 7) first. S(f)/G for each divided block is quantized by a multi-rate lattice vector quantizer (VQ in FIG. 7). As illustrated in FIG. 7, the quantized global gain's index is arranged in the first region at the head of a bit-stream. Then, codebook indication values (Cb1 to Cb5) are arranged in the second region from the head side in ascending order of the block number, and following the second region, code vector's indexes are arranged in the third region from the head side in ascending order of the block number.

In the second bit-stream forming method, global gain G is quantized by a scalar quantizer (Q in FIG. 8) first. S(f)/G for each divided block is quantized by a multi-rate lattice vector quantizer (VQ in FIG. 8). As illustrated in FIG. 8, the quantized global gain's index is arranged in the first region at the head of a bit-stream. Then, for each vector, a set of a codebook indication value and a code vector index is arranged in the second to seventh regions following the first region for each vector.

CITATION LIST

Non-Patent Literature

NPL 1
Karl Heinz Brandenburg, "MP3 and AAC Explained," AES 17th International Conference, Florence, Italy, September 1999
NPL 2
Lefebvre, et al., "High quality coding of wideband audio signals using transform coded excitation (TCX)," IEEE International Conference on Acoustics, Speech, and Signal Processing, vol. 1, pp. I/193-I/196, April 1994
NPL 3
ITU-T Recommendation G.729.1 (2007) "G.729-based embedded variable bit-rate coder: An 8-32 kbit/s scalable wideband coder bitstream interoperable with G.729"
NPL 4
T. Vaillancourt et al, "ITU-T EV-VBR: A Robust 8-32 kbit/s Scalable Coder for Error Prone Telecommunication Channels," in Proc. Eusipco, Lausanne, Switzerland, August 2008
NPL 5
M. Xie and J.-P. Adoul, "Embedded algebraic vector quantizers (EAVQ) with application to wideband speech coding," IEEE International Conference on Acoustics, Speech, and Signal Processing (ICASSP), Atlanta, Ga., U.S.A, 1996, vol. 1, pp. 240-243
NPL 6
3GPP TS 26.290 "Extended AMR Wideband (AMR-WB+) Codec"
NPL 7
S. Ragot, B. Bessette and R. Lefebvre, "Low-complexity Multi-Rate Lattice Vector Quantization with Application to Wideband TCX Speech Coding at 32 kbit/s," Proc. IEEE International Conference on Acoustics, Speech, and Signal Processing (ICASSP), Montreal, QC, Canada, May, 2004, vol. 1, pp. 501-504

SUMMARY OF INVENTION

Technical Problem

Typically, an input spectrum does not have equal energies for all of the blocks (hereinafter referred to as "sub-vectors" as appropriate), and energy tends to concentrate on a certain sub-vector. For example, in an exemplary spectrum illustrated in FIG. 9, sub-vector v3 has the largest energy among eight sub-vectors. Therefore, by processing of split multi-rate lattice VQ, the codebook of sub-vector v3 has the largest codebook number (integer n in "Qn" is referred to as a codebook number) compared to other sub-vectors.

As illustrated in the codebook list of FIG. 6, the larger the codebook number becomes, the larger the number of bits used by a codebook indication value (i.e., the number of bits used for representing the codebook indication value) becomes. In particular, in the example of FIG. 9, sub-vector v3 uses the largest number of bits (hereinafter referred to as "the largest bit count" as appropriate) for the codebook indication value. For a codebook having a larger codebook number, it is desirable to reduce the number of bits used by the codebook indication value.

According to NPL 7, split multi-rate lattice VQ is used for TCX speech codec under the conditions where the number of sub-vectors $N_{sv}=8$ and the number of available bits $Bits_{available}=132$. It is mentioned that in this case, 11 is measured as the largest codebook number.

In the example of spectrum illustrated in FIG. 9, it is assumed that sub-spectrum v3 uses codebook Q11, sub-spectrum v4 uses codebook Q3, and all other sub-spectrum use codebook Q2. The numbers of used bits in this case are summarized in FIG. 10.

As illustrated in FIG. 10, the codebook indication value of sub-vector v3 uses 11 bits, and the codebook indication value of sub-vector v4 uses 3 bits. The other sub-vector's codebook indication values use 2 bits. In other words, it can be seen that the codebook indication value of sub-vector v3 uses even five times as much the number of bits as the codebook indication value of sub-vector v1 (v2, v5, v6, v7 or v8).

In the technique disclosed in NPL 7, codebook indication values and code vector indexes are directly transformed into binary numbers to form a bit-stream. Accordingly, a total number of bits used for all the vectors is calculated by equation 2 as follows:

[2]

$$Bits_{total} = Bits_{gain\_q} + \sum_{i=1}^{N} Bits_{cb\_indication}(i) + \sum_{i=1}^{N} Bits_{cv\_index}(i) \quad \text{(Equation 2)}$$

In equation 2, $Bits_{total}$ is the total number of used bits, $Bits_{gain\_q}$ is the number of bits required for quantization of global gain, $Bits_{cb\_indication}$ is the number of used bits of codebook indication value per vector, $Bits_{cv\_index}$ is the number of used bits of code vector index per vector, and N is the total number of vectors in the whole spectrum.

When a codebook having a larger codebook number like that of sub-vector v3 illustrated in FIG. 9 is selected, its codebook indication value uses a larger number of bits, and therefor there is a problem in that the bit rate increases.

An object of the present invention is to provide a speech encoding apparatus, a speech decoding apparatus, a speech encoding method and a speech decoding method that enable a reduction of the bit rate even in a case where a codebook having a larger codebook number is selected in split multi-rate lattice vector quantization.

Solution to Problem

A speech encoding apparatus according to an aspect of the present invention includes: a time-frequency domain transform section that transforms a time domain input signal to a frequency domain signal; a vector quantization section that divides the frequency domain signal into a plurality of sub-vectors and quantizes spectral coefficients of each of the resultant sub-vectors; an encoding section that encodes codebook indication values of all of the sub-vectors obtained by the quantization; an identifying section that identifies a position of a sub-vector whose codebook indication value has a largest used bit count among all of the codebook indication values; an estimation section that estimates a number of bits used by the codebook indication value having the largest used bit count, based on a total number of bits available in transmission units of the input signal and a number of used bits of a codebook indication value other than the codebook indication value having the largest used bit count; a difference calculation section that calculates a difference between an actual value and an estimated value, the actual value being a number of bits obtained by encoding the codebook indication value having the largest used bit count by the encoding section, the estimated value being the estimated number of bits of the codebook indication value having the largest used bit count; and a parameter encoding section that encodes the identified position information of the sub-vector and the calculated difference information.

A speech decoding apparatus according to an aspect of the present invention includes: a parameter decoding section that acquires the encoded position information and difference information from the speech encoding apparatus described above, and decodes the encoded position information and difference information; a codebook indication value decoding section that acquires an encoded codebook indication value other than the codebook indication value having the largest used bit count from the speech encoding apparatus, and decodes the encoded codebook indication value; an estimation section that estimates a number of bits used by the codebook indication value having the largest used bit count based on the total number of bits available in transmission units of the input signal and the number of used bits of the codebook indication value other than the codebook indication value having the largest used bit count; an adding section that adds the estimated number of bits used by the codebook indication value having the largest used bit count and the decoded difference information to calculate a codebook indication value having the largest used bit count; a codebook indication value generation section that generates all codebook indication values using the decoded position information, the decoded codebook indication value other than the codebook indication value having the largest used bit count, and the calculated codebook indication value having the largest used bit count; a vector de-quantization section that de-quantizes spectral coefficients of each of the sub-vectors using all the generated codebook indication values; and a frequency-time transform section that transforms the de-quantized spectral coefficients into time domain.

A speech encoding method according to an aspect of the present invention includes: transforming a time domain input signal to a frequency domain signal; dividing the frequency domain signal into a plurality of sub-vectors and quantizing spectral coefficients of each of the divided sub-vectors; encoding codebook indication values of all of the sub-vectors obtained by the quantizing; identifying a position of a sub-vector whose codebook indication value has a largest used bit count among all of the codebook indication values; estimating a number of bits used by the codebook indication value having the largest used bit count based on a total number of bits available in transmission units of the input signal and a number of used bits of a codebook indication value other than the codebook indication value having the largest used bit count; calculating a difference between an actual value and an estimated value, the actual value being a number of bits obtained by the encoding of the codebook indication value having the largest used bit count, the estimated value being the estimated number of bits of the codebook indication value having the largest used bit count; and encoding the identified position information of the sub-vector and the calculated difference information as parameters.

A speech decoding method according to an aspect of the present invention includes: decoding the position information and the difference information encoded by the speech encoding method described above, as parameters; decoding a codebook indication value which is encoded by the speech encoding method and which is other than the codebook indication value having the largest used bit count; estimating a number of hits used by the codebook indication value having the largest used bit count based on a total number of bits available in transmission units of the input signal and the number of used bits of the codebook indication value other than the codebook indication value having the largest used bit count; adding the estimated number of bits used by the codebook indication value having the largest used bit count and the decoded difference information to calculate a codebook indication value having the largest used bit count; generating all codebook indication values using the decoded position information, the decoded codebook indication value other than the codebook indication value having the largest used bit count, and the calculated codebook indication value having the largest used bit count; de-quantizing spectral coefficients of each of the sub-vectors using all the generated codebook indication values; and transforming the de-quantized spectral coefficients into time domain.

Advantageous Effects of Invention

According to the present invention, in split multi-rate lattice vector quantization, a bit rate can be reduced even in a case where a codebook having a larger codebook number is selected.

BRIEF DESCRIPTION OF DRAWINGS

FIGS. 1A and 1B illustrate a simple configuration of a transform codec;

FIG. 6 is an overview of a codebook list of split multi-rate lattice VQ;

FIG. 10 illustrates codebooks and the numbers of used bits to be applied to the spectrum illustrated in FIG. 9;

FIG. 13 illustrates a correspondence between position information of sub-vectors and position information encoded code;

FIG. 14 illustrates a correspondence between difference information and difference information encoded code;

FIG. 17 illustrates codebooks and codebook indication values to be applied to the spectrum illustrated in FIG. 9;

DESCRIPTION OF EMBODIMENTS

Hereinafter, embodiments of the present invention will be described in detail with reference to the accompanying drawings.

(Embodiment 1)

Figure 11:
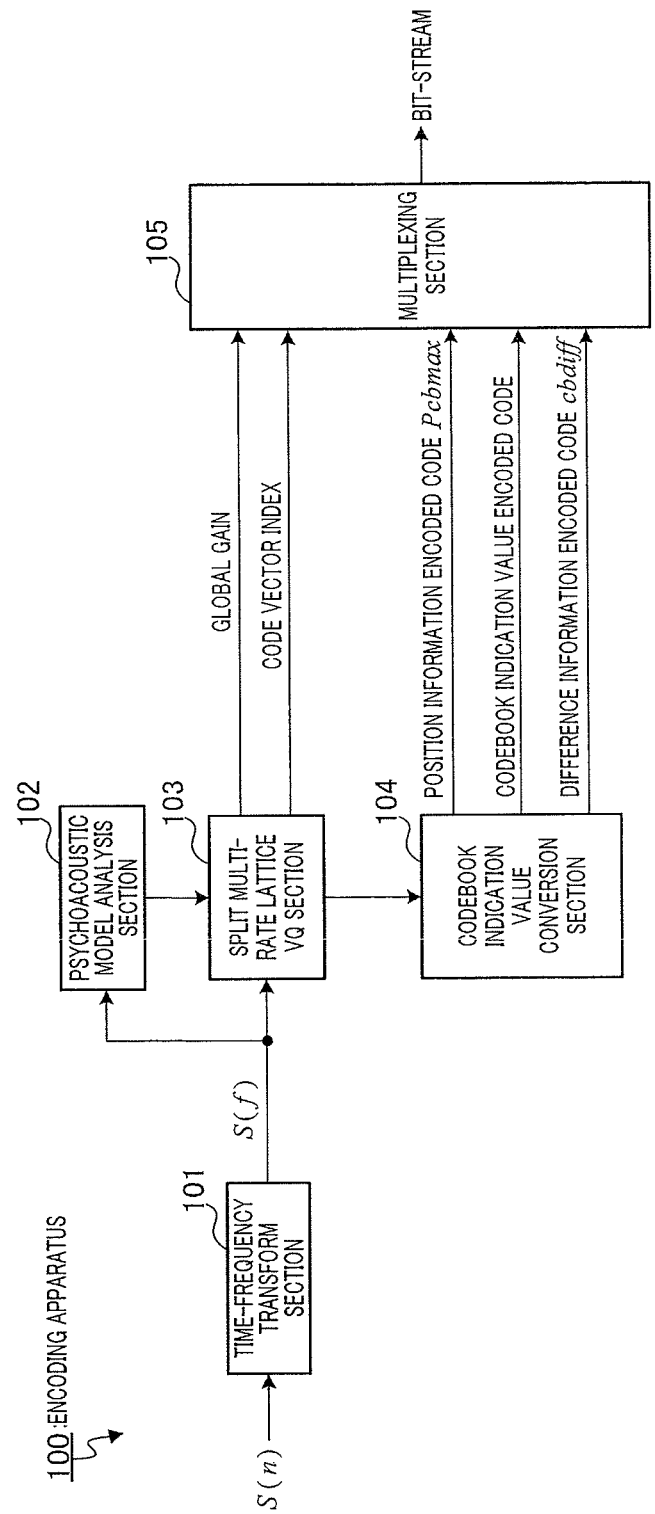
FIG. 11 is a block diagram illustrating a configuration of an encoding apparatus according to Embodiment 1 of the present invention.

FIG. 11 is a block diagram illustrating a configuration of encoding apparatus 100 according to Embodiment 1 of the present invention. In FIG. 11, time-frequency transform section 101 transforms time domain input signal S(n) to frequency domain input signal S(f) using a time-frequency transform method such as DFT or MDCT and outputs frequency domain input signal S(f) to psychoacoustic model analysis section 102 and split multi-rate lattice VQ section 103.

Psychoacoustic model analysis section 102 performs a psychoacoustic model analysis on frequency domain input signal S(f) outputted from time-frequency transform section 101 to acquire a masking curve. The acquired masking curve is outputted to split multi-rate lattice VQ section 103.

Split multi-rate lattice VQ section 103 applies split multi-rate lattice VQ to frequency domain input signal S(f) according to the masking curve outputted from psychoacoustic model analysis section 102 in order to make the quantization noise inaudible. The obtained global gain and code vector indexes are outputted to multiplexing section 105. Further, split multi-rate lattice VQ section 103 calculates codebook indication values of all the sub-vectors with reference to the codebook list in FIG. 6 and outputs the calculated codebook indication values to codebook indication value conversion section 104.

Codebook indication value conversion section 104 performs the following processing of steps 1 to 3 using codebook indication values of all the sub-vectors outputted from split multi-rate lattice VQ section 103.

(Step 1) The position of a sub-vector whose codebook indication value uses the largest bit count is identified from among codebook indication values outputted from split multi-rate lattice VQ section 103, the identified position information is encoded, and codebook indication values of all the sub-vectors except the sub-vector whose codebook indication value uses the largest bit count are encoded.

(Step 2) A codebook indication value of the sub-vector whose codebook indication value uses the largest bit count is estimated using the codebook indication values of all the sub-vectors except for the codebook indication value.

(Step 3) A difference between an actual number of used bits of the codebook indication value that uses the largest bit count and the number of used bits estimated in (step 2) is encoded.

Thus obtained position information encoded code, codebook indication value encoded code, and difference information encoded code are outputted to multiplexing section 105. Details of codebook indication value conversion section 104 will be described later.

Multiplexing section 105 multiplexes the global gain and code vector indexes outputted from split multi-rate lattice VQ section 103, and the position information encoded code, codebook indication value encoded code and difference information encoded code outputted from codebook indication value conversion section 104, and sends the multiplexed bit-stream information to the decoding apparatus.

Figure 12:
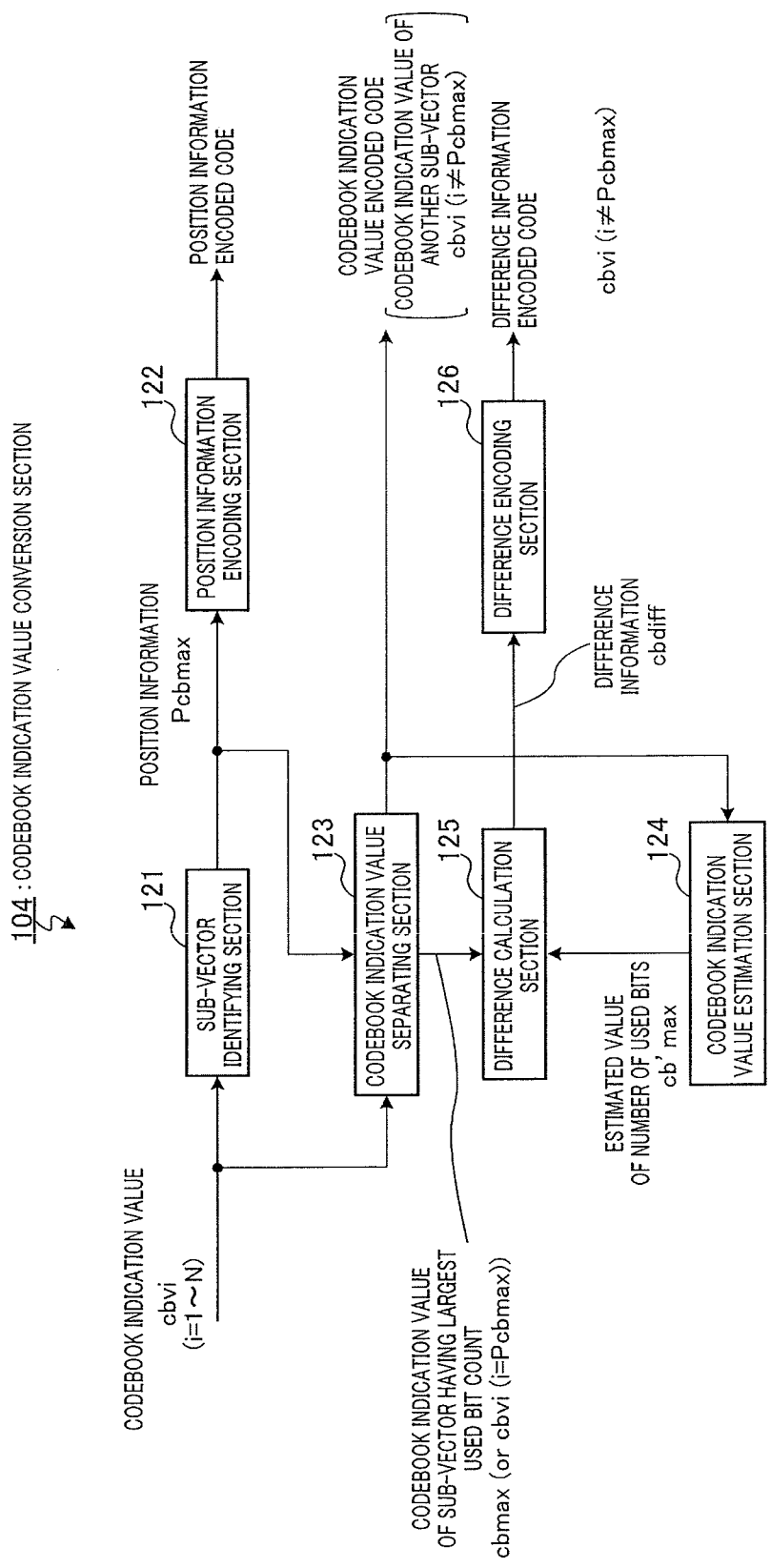
FIG. 12 is a block diagram illustrating an internal configuration of a codebook indication value conversion section illustrated in FIG. 11.

An internal configuration of above described codebook indication value conversion section 104 will be described using FIG. 12. Codebook indication values cbvi (i=1 to N) of N sub-vectors outputted from split multi-rate lattice VQ section 103 are inputted to sub-vector identifying section 121 and codebook indication value separating section 123 of codebook indication value conversion section 104.

Sub-vector identifying section 121 identifies a sub-vector whose codebook indication value uses the largest bit count with reference to inputted N codebook indication values cbvi, and outputs position information Pcbmax of the identified sub-vector to position information encoding section 122 and codebook indication value separating section 123 (in above described step 1).

Position information encoding section 122 generates position information encoded code from position information Pcbmax outputted from sub-vector identifying section 121 using a table of FIG. 13, and outputs the code to multiplexing section 105. FIG. 13 is a table that associates position information of sub-vectors with position information encoded code (in above described step 1).

With reference to inputted N codebook indication values cbvi, and position information Pcbmax outputted from sub-vector identifying section 121, codebook indication value separating section 123 outputs codebook indication value cbmax (or cbvi (i=Pcbmax)) of a sub-vector positioned at position information Pcbmax to difference calculation section 125. Then, codebook indication value separating section 123 outputs codebook indication values cbvi (i≠Pcbmax) of the other N−1 sub-vectors to codebook indication value estimation section 124, as well as outputting them as codebook indication encoded code to multiplexing section 105 (in above described step 1)

Codebook indication value estimation section 124 estimates the number of used bits of a codebook indication value that uses the largest number of bits (hereinafter referred to as "the largest used bit count" as appropriate) using the other N−1 codebook indication values, to generate estimated value of the number of used bits cb'max and output the value to difference calculation section 125.

The number of used bits of the codebook indication value having the largest used bit count is estimated by equation 3 as follows:

$$cb'\max = \left(Bits_{available} - \sum_{i \neq Pcbmax} Bits_{cbvi}\right) / 5 \quad \text{(Equation 3)}$$

[3]

In equation 3, the right-hand Σ calculates a total sum of all $Bits_{cbvi}$ except $Bits_{cbvi}$ where i is Pcbmax. In addition, cb'max denotes an estimated value of the number of used bits of a codebook indication value having the largest used bit count, $Bits_{available}$ denotes a total number of bits available in transmission units of an input signal, and $Bits_{cbvi}$ denotes the number of used bits of a codebook indication value of a sub-vector vi. However, a total number of bits available in a relevant frame may be previously set to a predefined value, or may be a numerical value that is obtained by subtracting the number of bits used in previous encoding processing such as global gain from a predefined value and can be referenced by the encoding apparatuses and the decoding apparatus.

As described above, codebook indication value estimation section 124 estimates the number of used bits of the codebook indication value having the largest used bit count by subtracting the number of bits used by codebook indication values of N−1 sub-vectors from the total number of bits as represented in equation 3 (in above described step 2).

Because the ratio of the number of used bits of a codebook indication value and the number of used bits of a code vector index is 1:4 as illustrated in FIG. 6, the divisor is 5 in equation 3. Accordingly, the estimated value of the number of used bits of the codebook indication value is calculated by dividing the number of bits after subtraction (at this time, including the number of used bits of both codebook indication values and code vector indexes) by 5.

Difference calculation section 125 calculates difference information cbdiff by subtracting the estimated value of the number of used bits (cb'max) outputted from codebook indication value estimation section 124 from the number of used bits of the codebook indication value having the largest used bit count (actual value cbmax) outputted from codebook indication value separating section 123 (cbmax−cb'max), and outputs the difference information to difference encoding section 126.

Difference encoding section 126 generates difference information encoded code from difference information cbdiff based on a table illustrated in FIG. 14 and outputs the code to multiplexing section 105 (in above described step 3). FIG. 14 is a table that associates difference information cbdiff with difference information encoded code. As can be seen from FIG. 14, difference information cbdiff is a negative integer less than or equal to 0. This is because the estimated value of the number of used bits of a codebook indication value having the largest used bit count is calculated on the assumption that the number of all the available bits is used for quantization, and the number of bits larger than the number of bits available for quantization is not used. In other words, the estimated value is the maximum possible value and cannot be less than the actual value.

Figure 15:
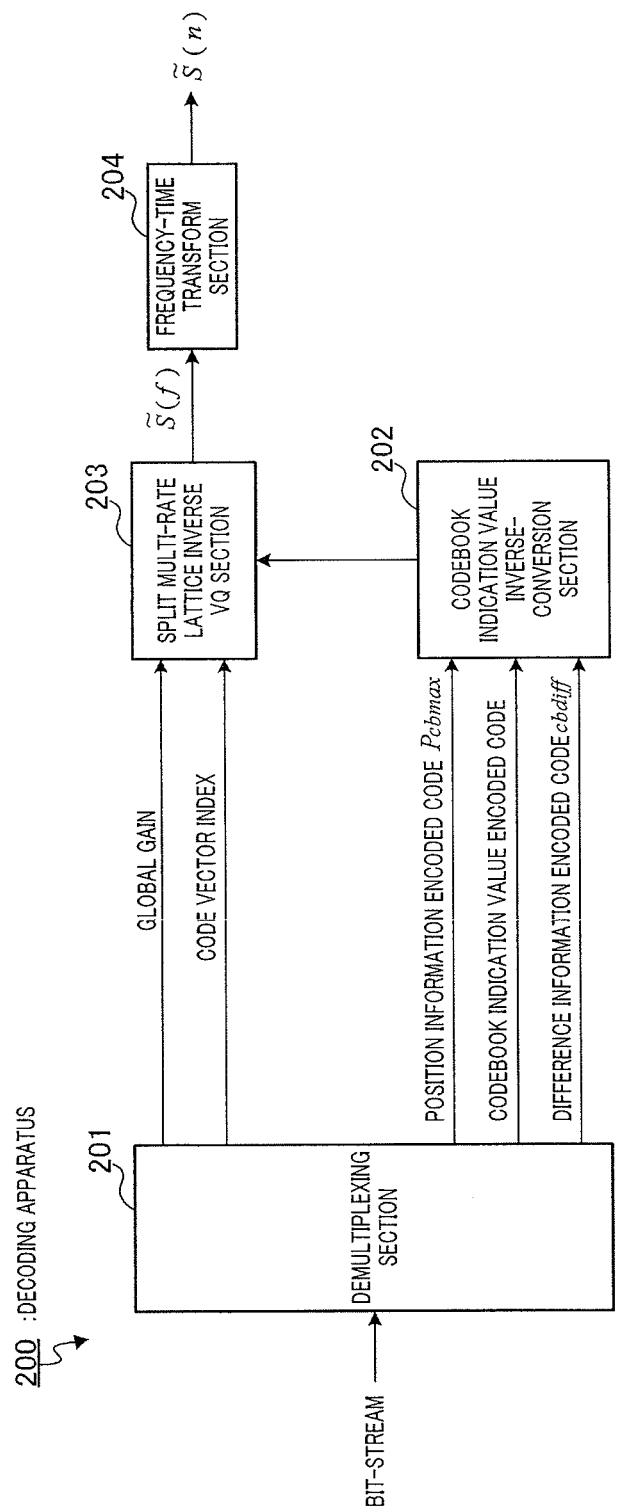
FIG. 15 is a block diagram illustrating a configuration of a decoding apparatus according to Embodiment 1 of the present invention.

FIG. 15 is a block diagram illustrating a configuration of decoding apparatus 200 according to Embodiment 1 of the present invention. In FIG. 15, all the bit-stream information sent from encoding apparatus 100 is inputted to demultiplexing section 201.

Demultiplexing section 201 demultiplexes the inputted bit-stream information into global gain, code vector indexes, position information encoded code, codebook indication value encoded code, and difference information encoded code. The demultiplexed global gain and code vector indexes are outputted to split multi-rate lattice inverse VQ section 203, and the demultiplexed position information encoded code, codebook indication value encoded code and difference information encoded code are outputted to codebook indication value inverse-conversion section 202.

Codebook indication value inverse-conversion section 202 performs processing of the following step 4 to step 8 using the position information encoded code, codebook indication value encoded code and difference information encoded code outputted from demultiplexing section 201.

(Step 4) The position of a sub-vector of a codebook indication value having the largest used bit count is decoded.

(Step 5) All the other sub-vectors' codebook indication values are decoded.

(Step 6) The number of used bits of the codebook indication value having the largest used bit count is estimated using the numbers of used bits of the codebook indication values of all the sub-vectors except for the number of used bits of the codebook indication value.

(Step 7) Difference information encoded code is decoded.

(Step 8) The codebook indication value having the largest used bit count is calculated by adding the estimated value of the number of used bits estimated in step 6 and the difference information decoded in step 7.

The decoded codebook indication value is outputted to split multi-rate lattice inverse VQ section 203. Details of codebook indication value inverse-conversion section 202 will be described later.

Split multi-rate lattice inverse VQ section 203 applies split multi-rate lattice inverse VQ to the global gain and code vector indexes outputted from demultiplexing section 201 and the codebook indication values outputted from codebook indication value inverse-conversion section 202, to decode them into frequency domain signal S~(f). The decoded frequency domain signal S~(f) is outputted to frequency-time transform section 204.

Frequency-time transform section 204 transforms frequency domain signal S~(f) outputted from split multi-rate lattice inverse VQ section 203 to time domain signal S~(n) using the frequency-time transform method such as IDFT or IMDCT.

Figure 16:
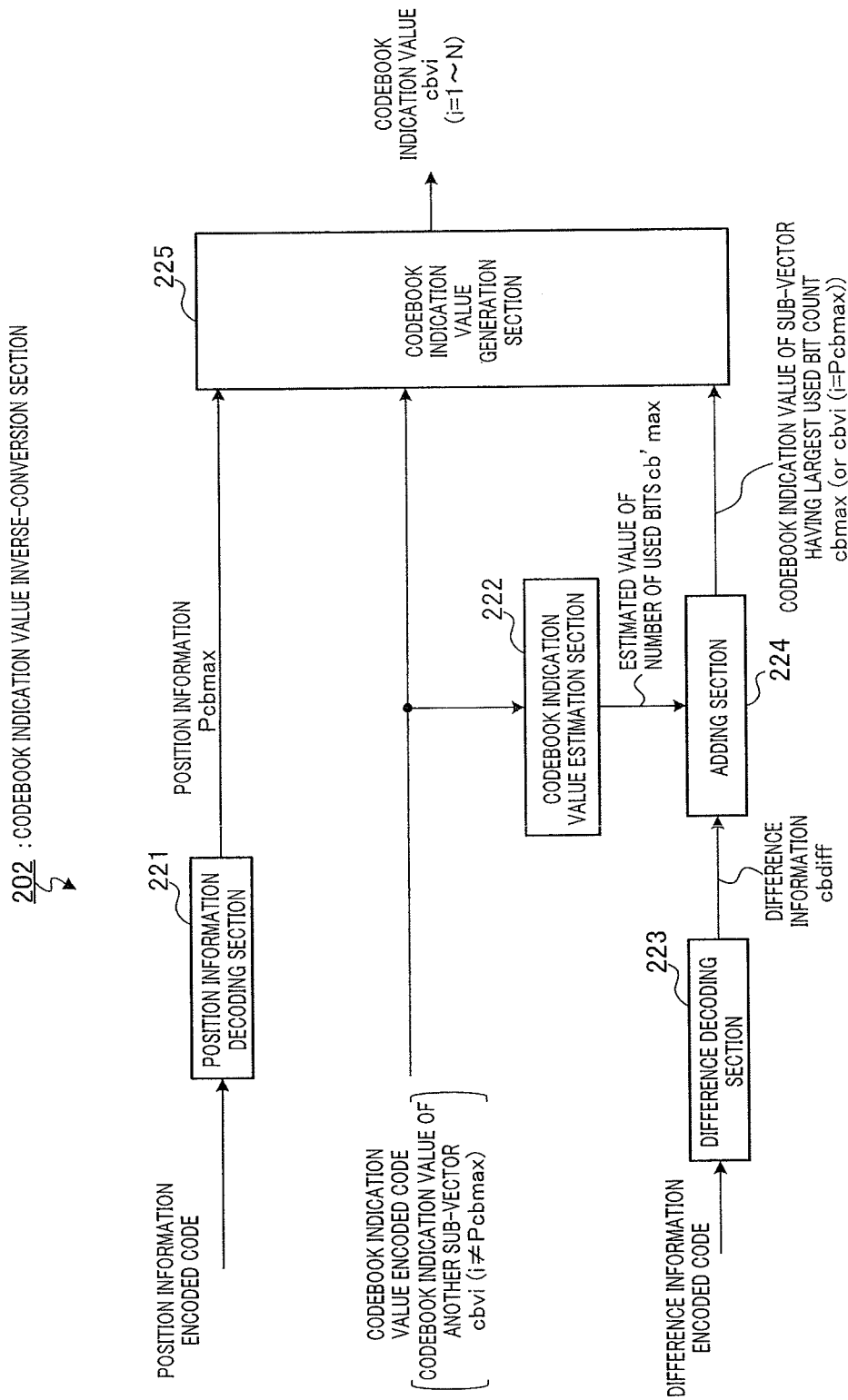
FIG. 16 is a block diagram illustrating an internal configuration of a codebook indication value inverse-conversion section illustrated in FIG. 15.

The internal configuration of above described codebook indication value inverse-conversion section 202 will be described using FIG. 16. The position information encoded code outputted from demultiplexing section 201 is inputted to position information decoding section 221, the codebook indication value encoded code is inputted to codebook indication value estimation section 222 and codebook indication value generation section 225, and the difference information encoded code is inputted to difference decoding section 223.

Position information decoding section 221 generates position information Pcbmax corresponding to the position information encoded code outputted from demultiplexing section 201 with reference to the table of FIG. 13, and outputs the information to codebook indication value generation section 225 (in above described step 4).

The codebook indication value encoded code outputted from demultiplexing section 201, which represents codebook indication value cbvi (i≠Pcbmax) of N−1 sub-vectors except the sub-vector of position information Pcbmax, is provided to codebook indication value generation section 225 and codebook indication value estimation section 222 (in above described step 5).

Codebook indication value estimation section 222 calculates the estimated value of the number of used bits cb'max of a codebook indication value of a sub-vector positioned at position information Pcbmax using N−1 codebook indication values cbvi (i≠Pcbmax) outputted from demultiplexing section 201, and outputs the value to adding section 224 (in above described step 6). Since codebook indication value estimation section 222 performs similar processing to the encoding apparatus side in FIG. 12, a detailed description thereof is omitted herein.

Difference decoding section 223 generates difference information cbdiff corresponding to the difference information encoded code outputted from demultiplexing section 201 with reference to the table of FIG. 14, and outputs it to adding section 224 (in above described step 7).

Adding section 224 adds difference information cbdiff outputted from difference decoding section 223 to estimated value of the number of used bits cb'max outputted from codebook indication value estimation section 222, to generate codebook indication value cbmax (or cbvi (i=Pcbmax)) of the sub-vector positioned at position information Pcbmax, and outputs the value to codebook indication value generation section 225 (in above described step 8).

Codebook indication value generation section 225 generates all codebook indication values cbvi (i=1 to N) such that codebook indication value cbmax is arranged at position information Pcbmax, using position information Pcbmax outputted from position information decoding section 221, codebook indication values cbvi (i≠Pcbmax) of N−1 sub-vectors outputted from demultiplexing section 201, and codebook indication value cbmax of the sub-vector positioned at position information Pcbmax outputted from adding section 224, and outputs the generated codebook indication values to split multi-rate lattice inverse VQ section 203.

Figure 9:
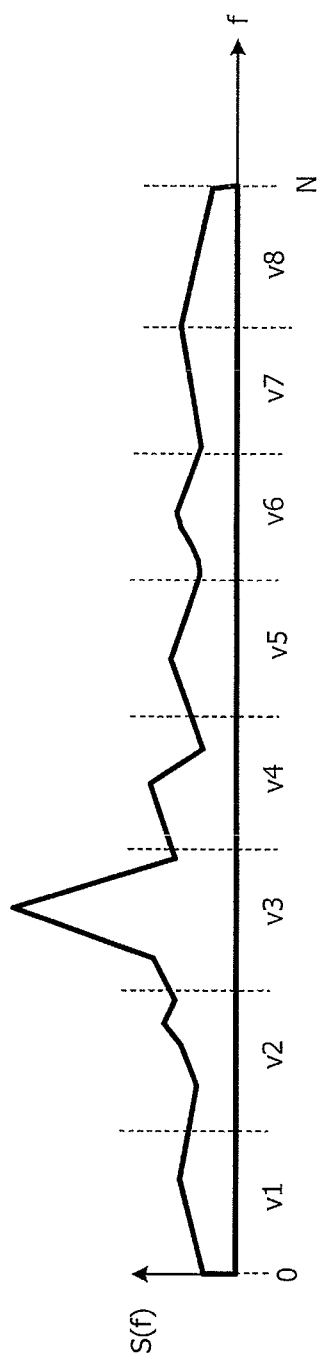
FIG. 9 illustrates a spectrum of an input signal.

Operation of codebook indication value conversion section 104 illustrated in FIG. 12 will be specifically described below using a case where the spectrum illustrated in FIG. 9 is encoded, for example.

The spectrum in FIG. 9 is supposed to be frequency domain input signal S(f) transformed by time-frequency transform section 101 of encoding apparatus 100, and then codebook indication value cbvi (i=1 to 8) illustrated in FIG. 17 is assumed to be inputted to sub-vector identifying section 121. Then, sub-vector identifying section 121 identifies sub-vector v3 whose codebook indication value uses the largest bit count, and outputs sub-vector v3 as position information Pcbmax to position information encoding section 122 and codebook indication value separating section 123.

Position information encoding section 122 encodes position information Pcbmax outputted from sub-vector identifying section 121 using the table of FIG. 13. Since position information Pcbmax indicates sub-vector v3, position information encoded code "010" is generated according to the table of FIG. 13.

Codebook indication value separating section 123 outputs, to difference calculation section 125, based on inputted codebook indication value cbvi illustrated in FIG. 17 and position information Pcbmax which indicates sub-vector v3 identified by sub-vector identifying section 121, a codebook indication value of sub-vector v3, that is, "11111111110" according to FIG. 17 (therefore, the number of used bits of the codebook indication value of sub-vector 3 is 11). In addition, codebook indication values of other sub-vectors v1, v2, v4 to v8 than sub-vector v3, that is, "10," "10," "110," "10," "10," "10," "10" according to FIG. 17 are outputted as codebook indication value encoded code to multiplexing section 105.

Codebook indication value estimation section 124 estimates the number of used bits of the codebook indication value having the largest used bit count, that is, the number of used bits of the codebook indication value of sub-vector v3 in this example. Specifically, when the total number of bits available in transmission units of the input signal is assumed to be 132, and the number of used bits per sub-vector of each sub-vector except sub-vector v3 is to be obtained from FIG. 10, (132−10−10−15−10−10−10−10)/5≈11 is obtained as the estimated value of the number of used bits according to equation 3.

Difference calculation section 125 subtracts the estimated value of the number of used bits (11 bits in this example) outputted from codebook indication value estimation section 124 from the number of used bits of the codebook indication value of sub-vector v3 (11 bits in this example) outputted from codebook indication value separating section 123, to calculate difference information cbdiff (11−11=0 in this example).

The difference information cbdiff calculated by difference calculation section 125 is 0, so that difference encoding section 126 generates difference information encoded code "0" according to the table of FIG. 14.

Position information encoded code "010," codebook indication value encoded code "10," "10," "110," "10," "10," "10," "10," and difference information encoded code "0" generated as described above are multiplexed by multiplexing section 105 to be outputted to decoding apparatus 200.

As described above, in the example illustrated in FIG. 9, the largest codebook number applied to sub-vector v3 is 11, and the number of bits used for this codebook indication value is 11.

For encoding of position information Pcbmax, a fixed number of bits ($Bits_{position\_cbmax}=\log_2(N_{sv})$) is used. In this example, 3 bits are used for encoding of position information since the number of sub-vectors is $N_{sv}=8$. The number of used bits for the difference information is 1 as described above.

Accordingly, in the example illustrated in FIG. 9, the codebook indication value of sub-vector v3, which should be indicated by 11 bits, can be indicated by 3-bit position information and 1-bit difference information, so that the number of bits is reduced by 7. In this way, even if the bits are reduced, there is no loss of information, and the original codebook indication value can be restored completely.

As described above, according to Embodiment 1, a codebook indication value that uses the largest bit count within the input signal's spectrum divided into a prescribed number of sub-vectors is transformed to difference information based on an actual number of used bits and an estimated value of the number of used bits, and position information of a sub-vector that uses the codebook indication value, so that the number of used bits of the codebook indication value that uses the largest bit count can be reduced, and therefore the bit rate can be reduced.

Figures 2A, 2B:
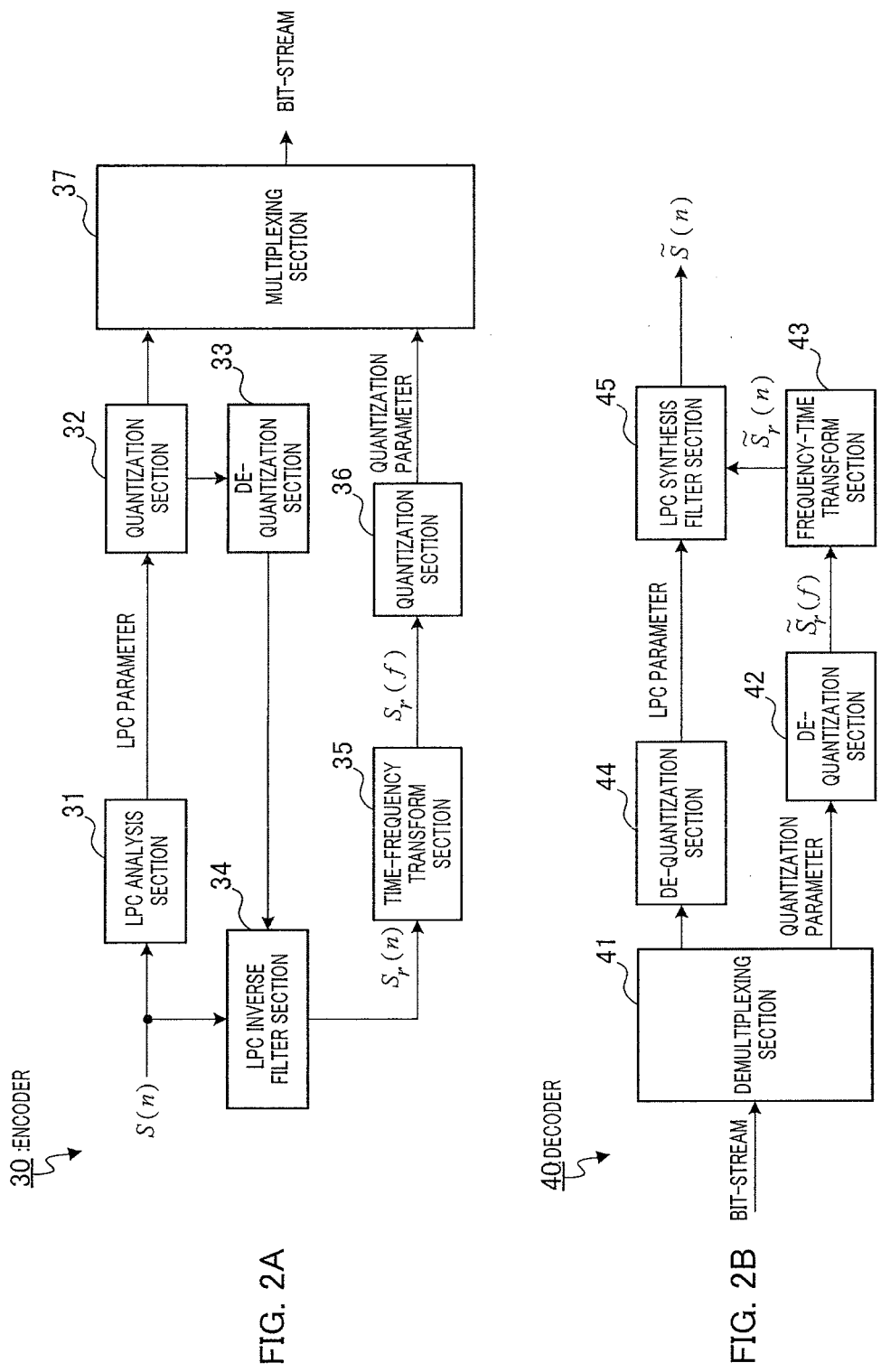
FIGS. 2A and 2B illustrate a simple configuration of a TCX codec.
Figures 3A, 3B:
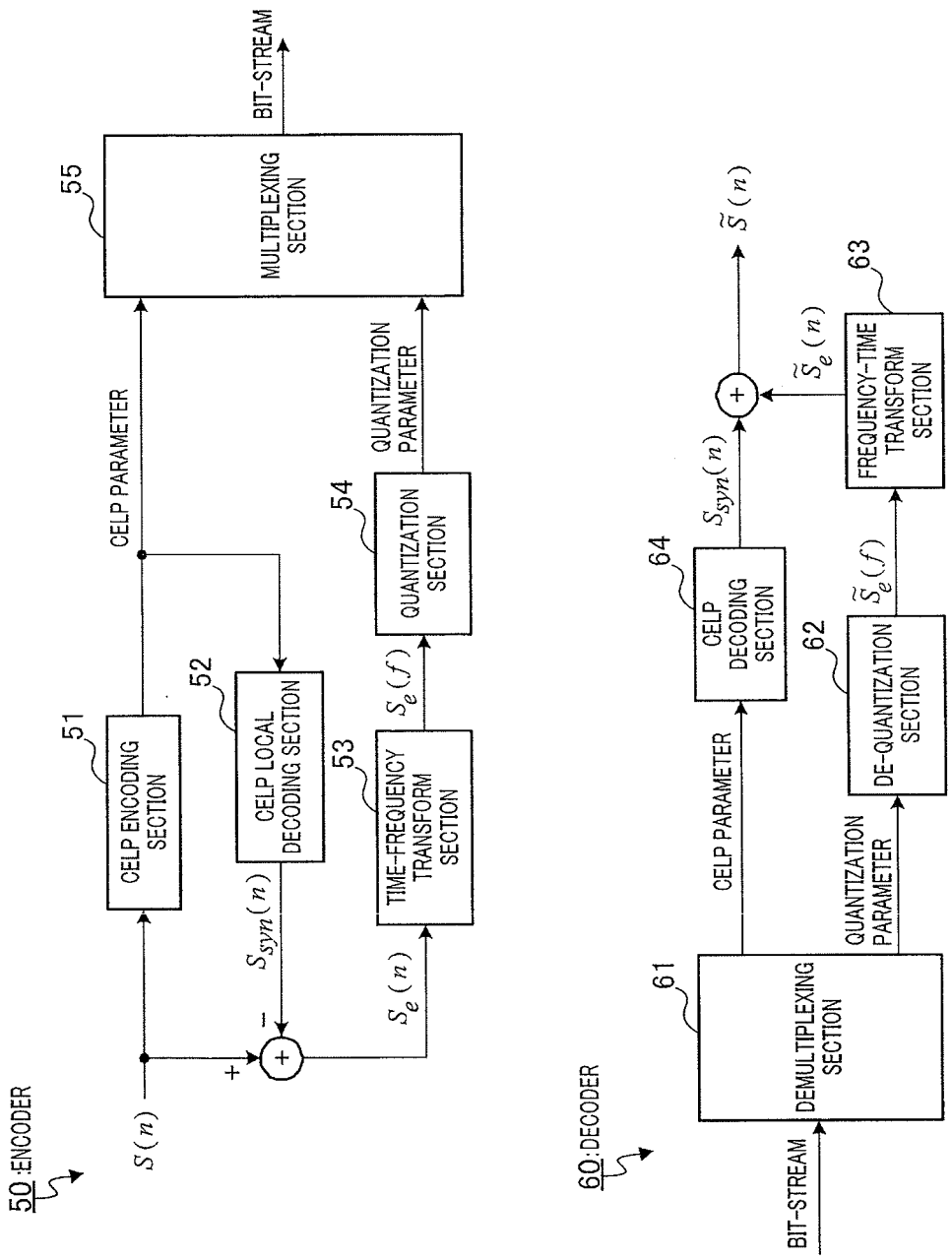
FIGS. 3A and 3B illustrate a simple configuration of layer coding of CELP and transform coding.
Figure 18A:
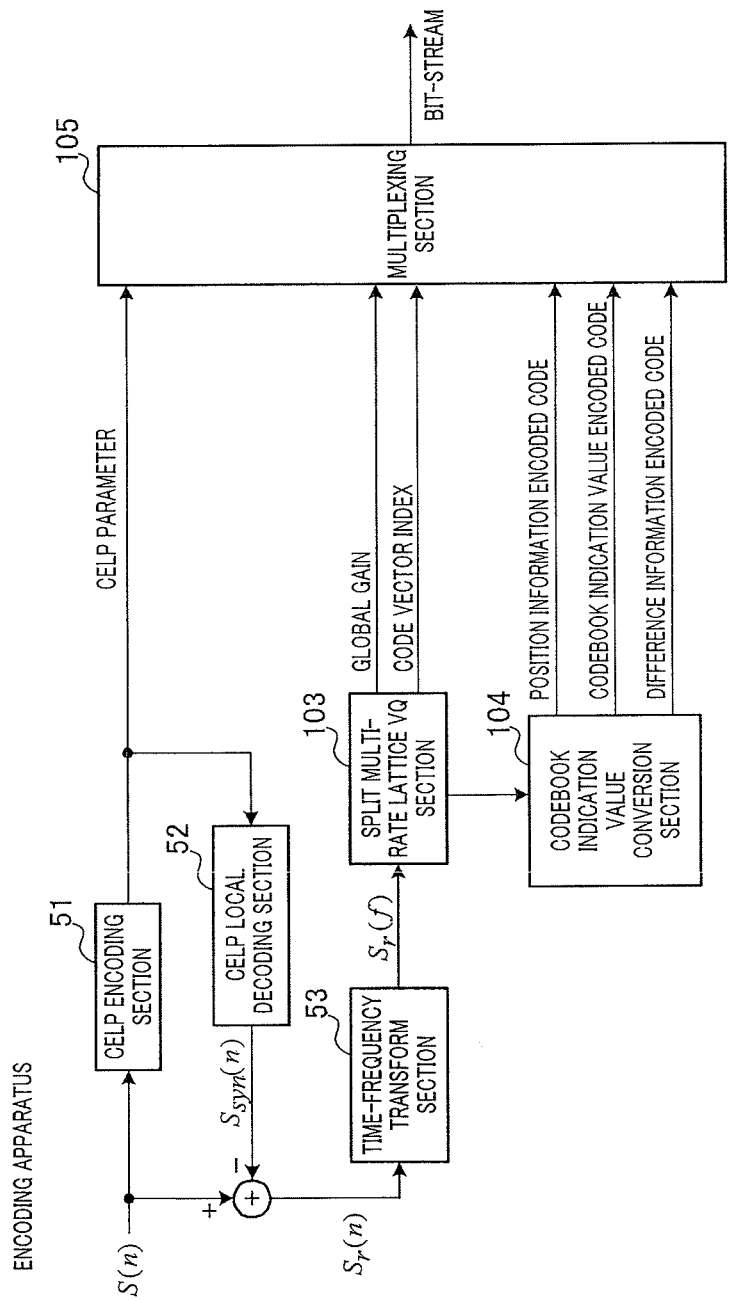
FIGS. 18A and 18B are block diagrams illustrating a configuration of a codec in which split multi-rate lattice VQ according to Embodiment 1 of the present invention is applied to layer coding of CELP and transform coding.
Figure 18B:
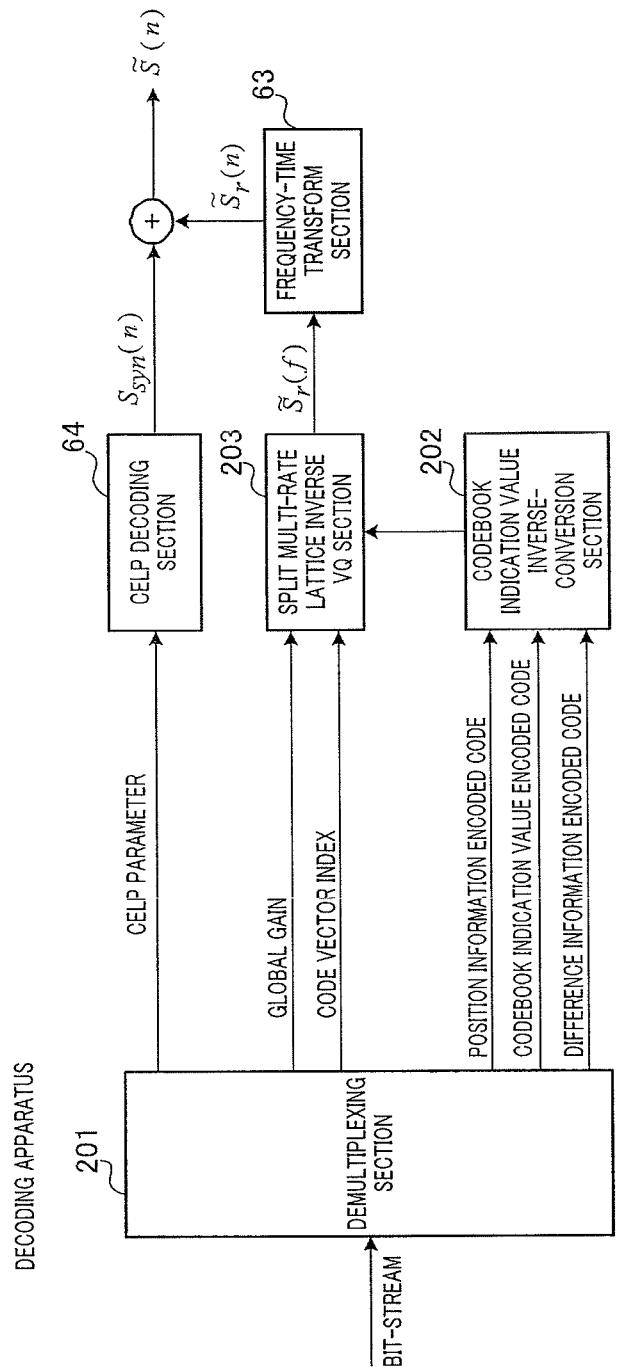

The split multi-rate lattice VQ according to the present embodiment may be applied to layer coding of CELP and transform coding, and the configuration of a codec in this case is illustrated in FIGS. 18A and 18B. FIG. 18A is different from FIG. 3A in that quantization section 54 of the encoder in FIG. 3A is replaced by split multi-rate lattice VQ section 103 and codebook indication value conversion section 104, and FIG. 18B is different from FIG. 3B in that de-quantization section 62 of the decoder in FIG. 3B is replaced by codebook indication value inverse-conversion section 202 and split multi-rate lattice inverse VQ section 203.

Figures 4A, 4B:
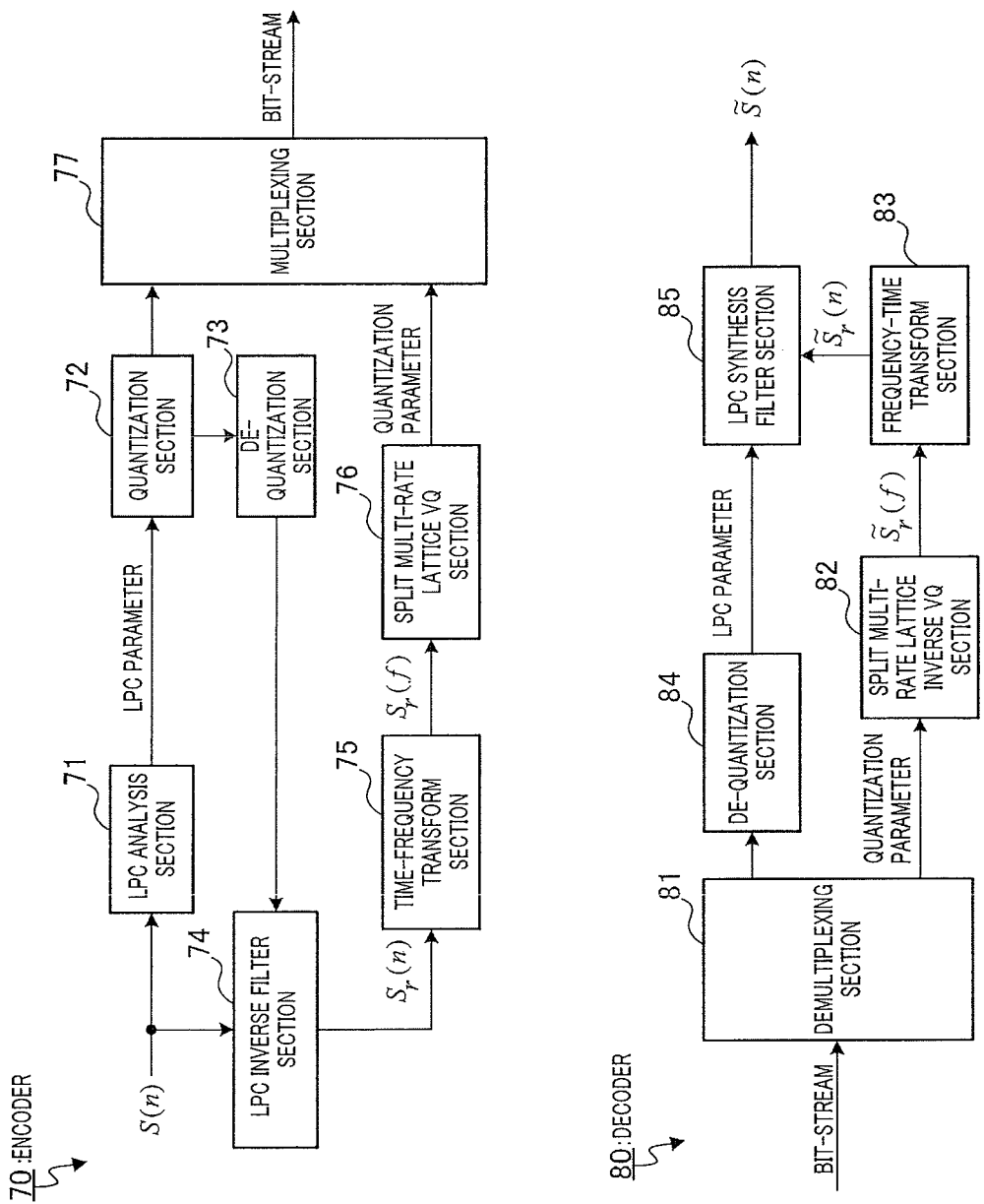
FIGS. 4A and B illustrate a simple configuration using split multi-rate lattice VQ in a TCX codec.
Figure 5:
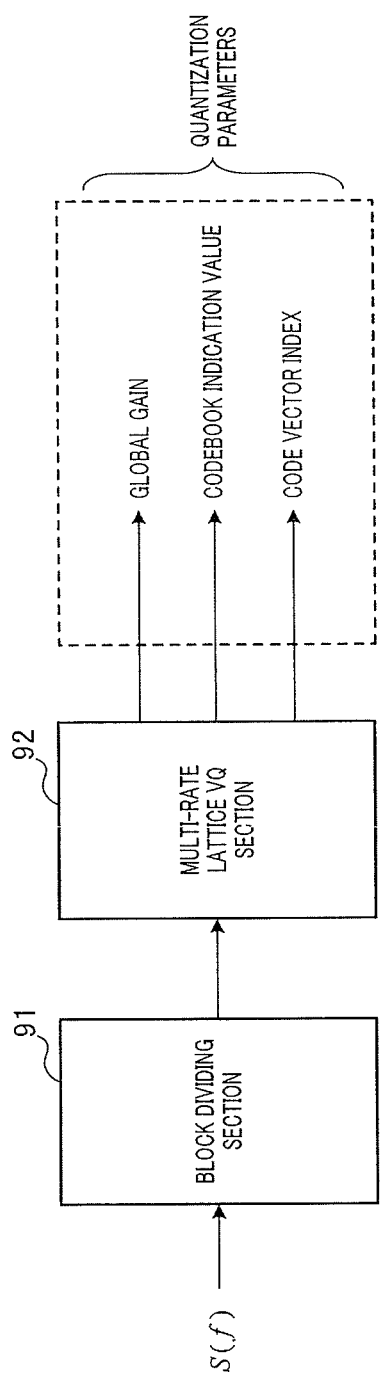
FIG. 5 is a block diagram illustrating processing of split multi-rate lattice VQ.
Figure 7:
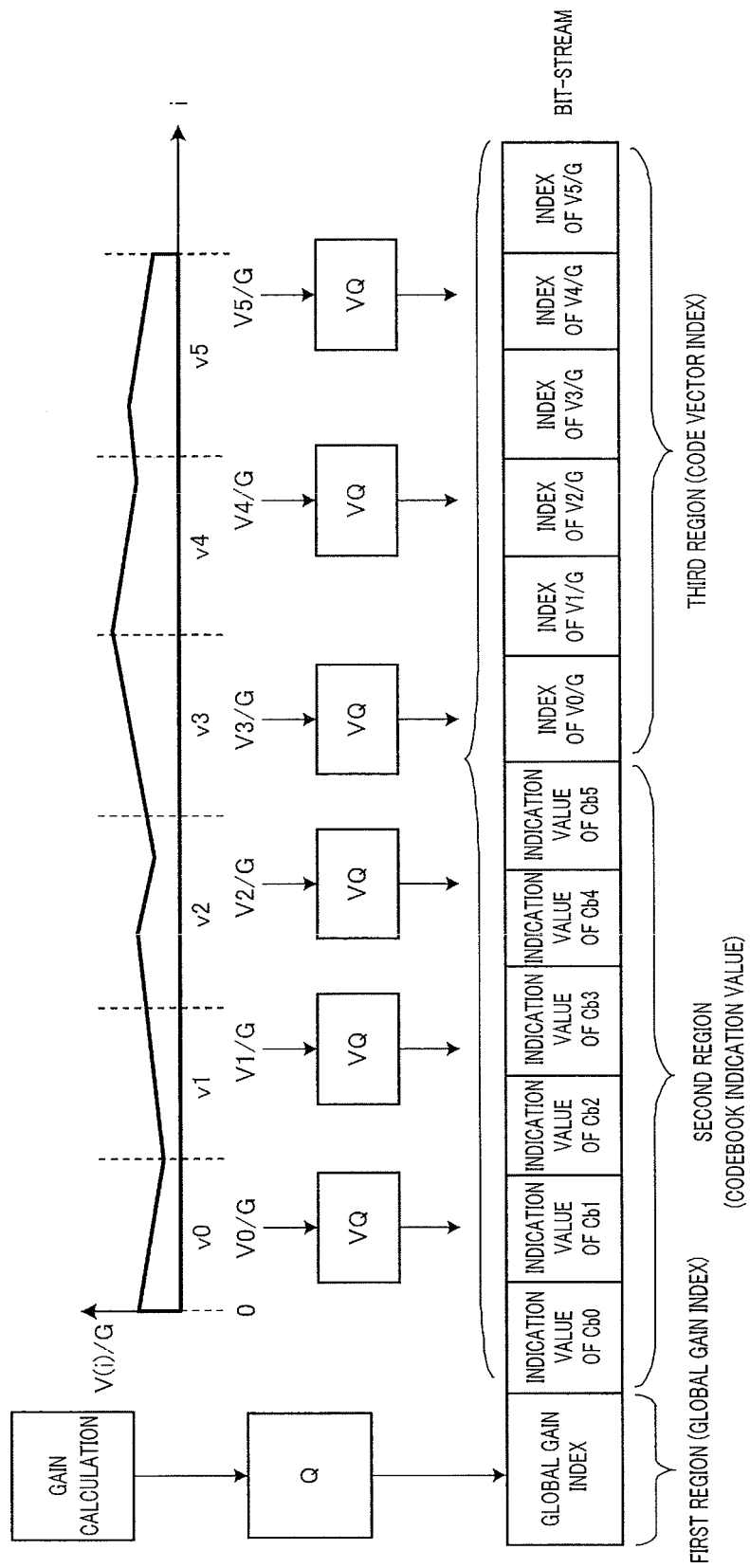
FIG. 7 illustrates the first bit-stream forming method.
Figure 8:
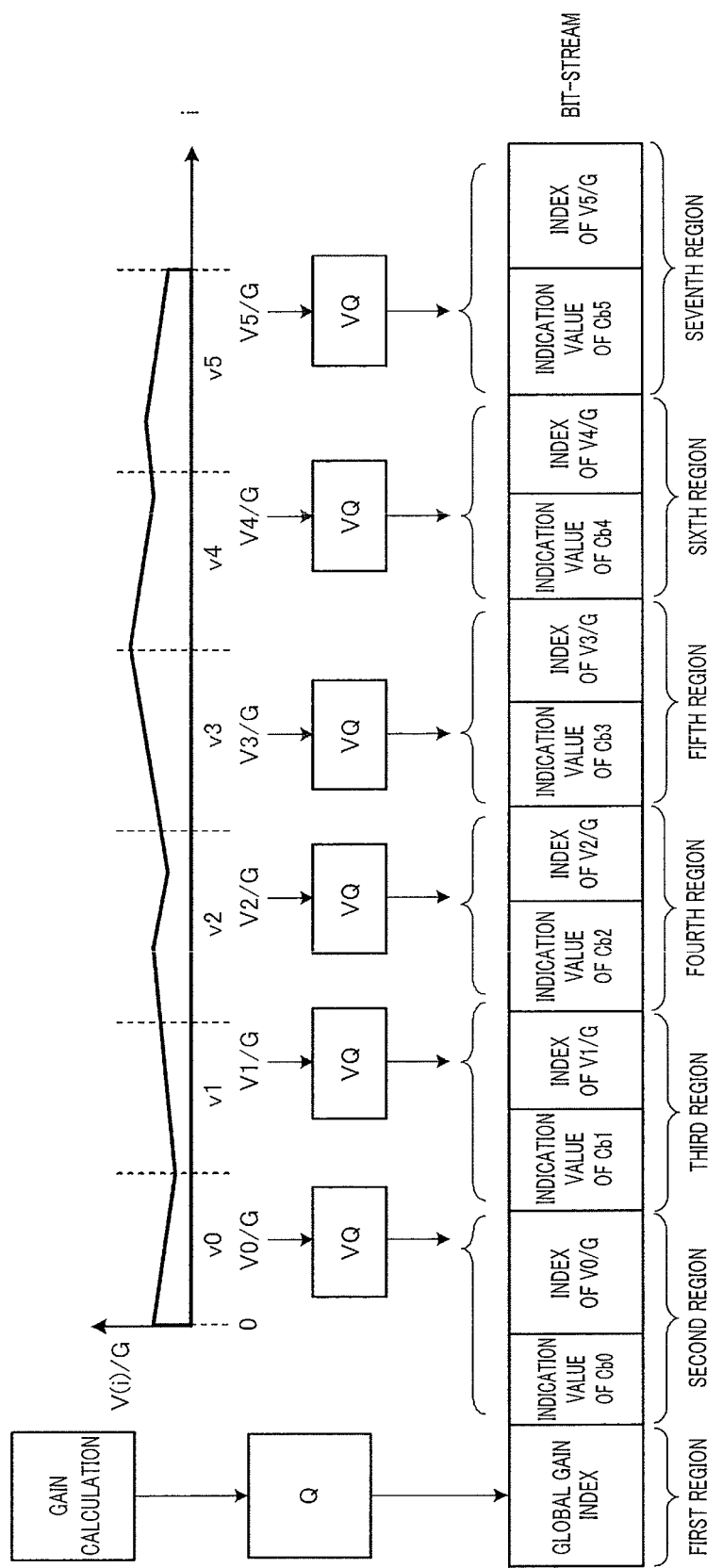
FIG. 8 illustrates the second bit-stream forming method.
Figure 19A:
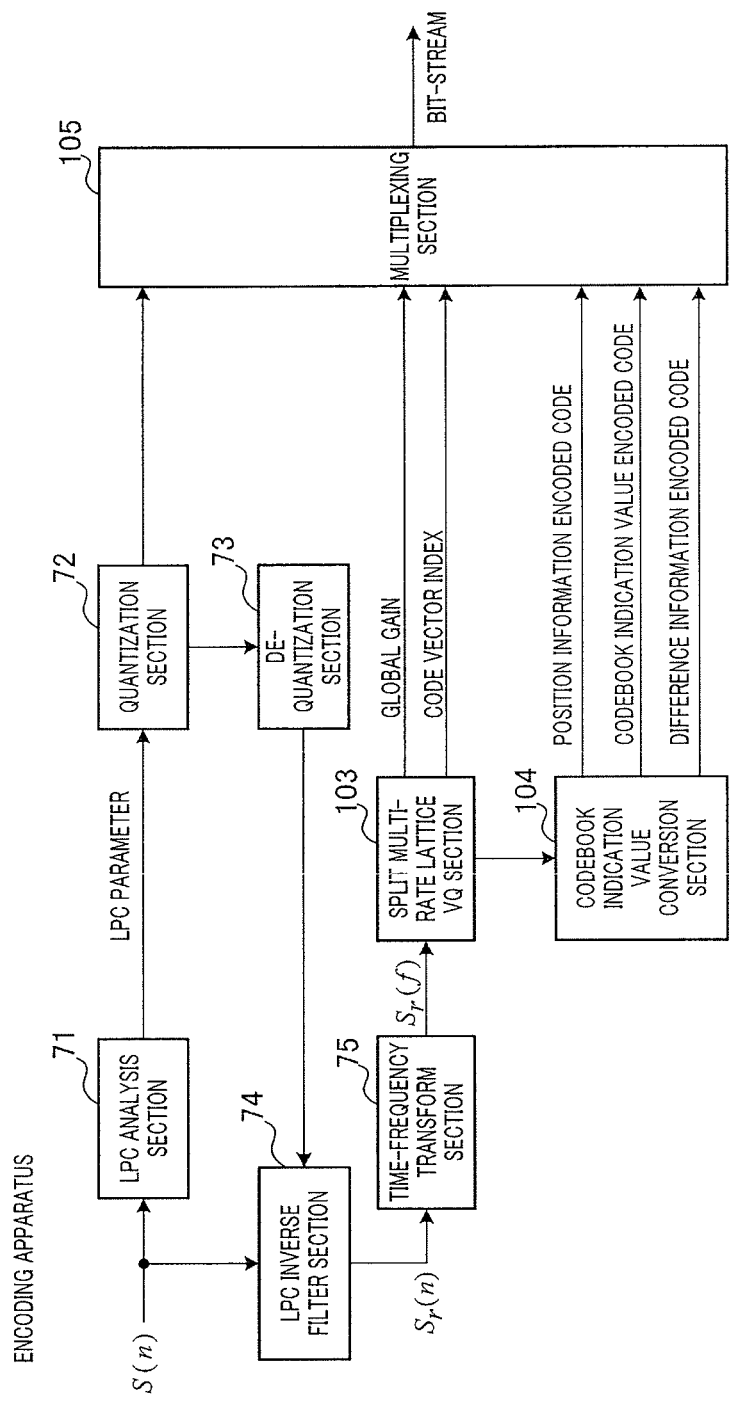
FIGS. 19A and 19B are block diagrams illustrating a configuration of a codec in which split multi-rate lattice VQ according to Embodiment 1 of the present invention is applied to a TCX codec.
Figure 19B:
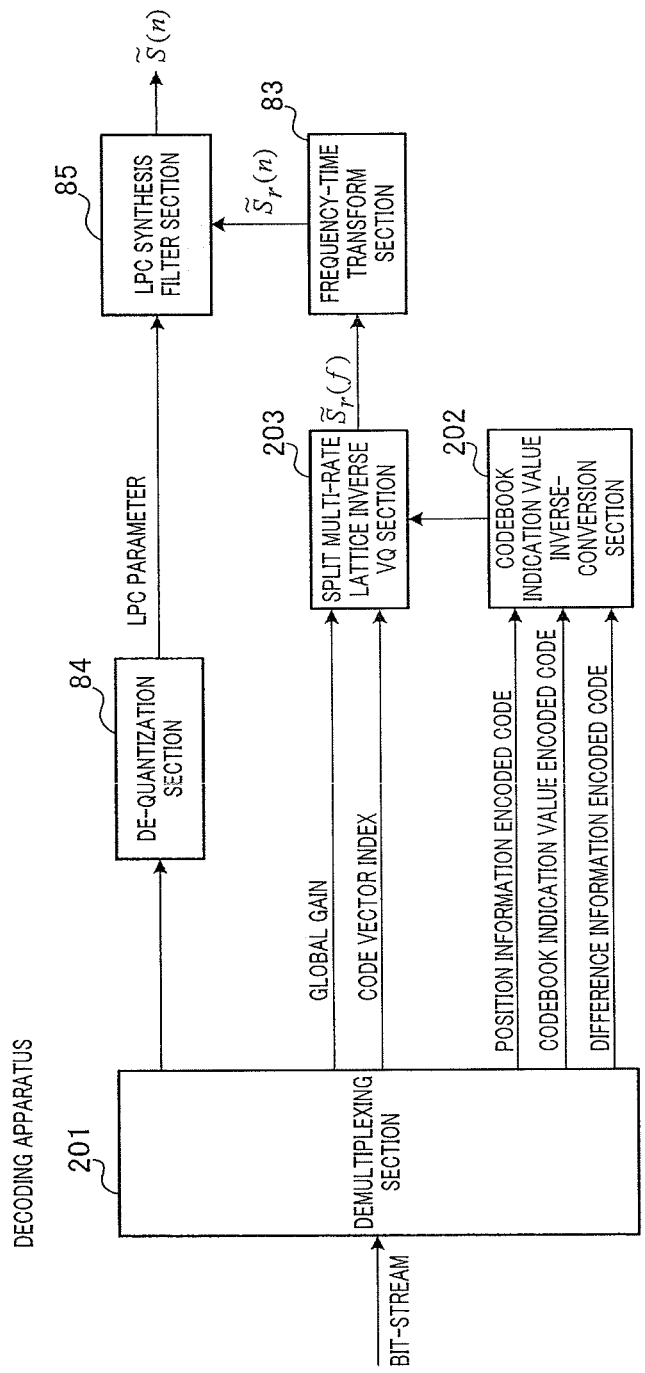

Further, the split multi-rate lattice VQ according to the present embodiment may be applied to a TCX codec, and a configuration of a codec this case is illustrated in FIGS. 19A and 19B. FIG. 19A is different from FIG. 4A in that split multi-rate lattice VQ section 76 of the encoder in FIG. 4A is replaced by split multi-rate lattice VQ section 103 and codebook indication value conversion section 104, and FIG. 19B is different from FIG. 4B in that split multi-rate lattice inverse VQ section 82 of the decoder in FIG. 4B is replaced by codebook indication value inverse-conversion section 202 and split multi-rate lattice inverse VQ section 203.

(Embodiment 2)

Embodiment 1 has been described assuming that the spectrum of an input signal is divided into a prescribed number of sub-vectors, and energy is concentrated on a specific sub-vector. However, there may be a case where energy is not concentrated on any specific sub-vector, and in this case, the number of used bits may increase in Embodiment 1.

To solve this problem, Embodiment 2 of the present invention will be described using a case where the number of used bits is reduced even if energy is not concentrated on any specific sub-vector will be described.

The configurations of an encoding apparatus and a decoding apparatus according to Embodiment 2 of the present invention are different from the configurations illustrated in FIGS. 11 and 15 of Embodiment 1 only in functions of codebook indication value conversion section 104 and codebook indication value inverse-conversion section 202. Therefore, FIGS. 11 and 15 are used to different functions while duplicate descriptions are omitted.

Figure 20:
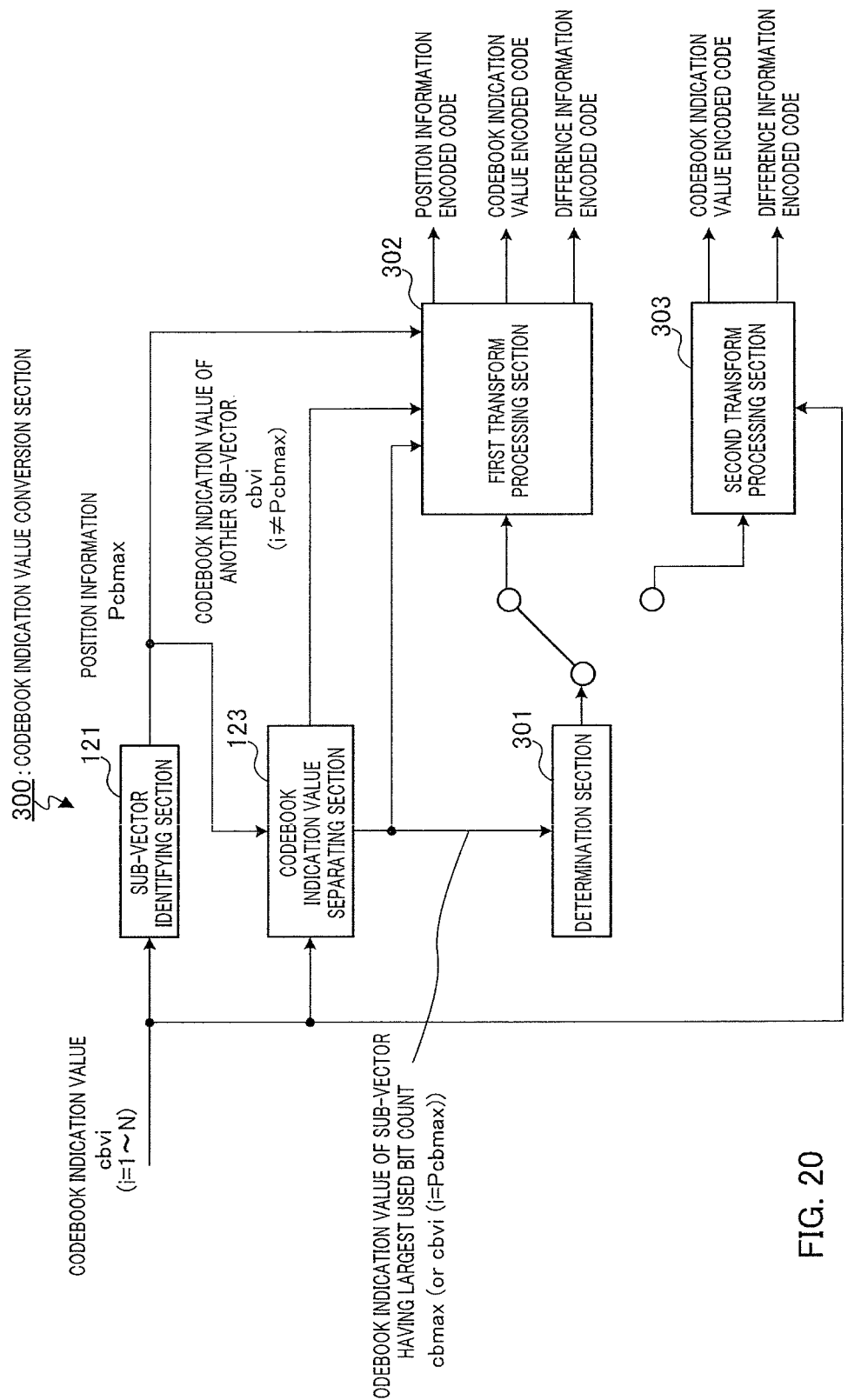
FIG. 20 is a block diagram illustrating an internal configuration of a codebook indication value conversion section according to Embodiment 2 of the present invention.

FIG. 20 is a block diagram illustrating an internal configuration of codebook indication value conversion section 300 according to Embodiment 2 of the present invention. FIG. 20 is different from FIG. 12 in determination section 301, first transform processing section 302 and second transform processing section 303.

Determination section 301 compares a prescribed threshold with the number of used bits of a codebook indication value of a sub-vector having the largest used bits outputted from codebook indication value separating section 123. If the number of used bits of the codebook indication value is larger than the threshold as a result of the comparison, determination section 301 changes a switch to first transform processing section 302 to connect with first transform processing section 302. On the other hand, If the number of used bits of the codebook indication value is less than or equal to the threshold, determination section 301 changes a switch to second transform processing section 303 to connect with second transform processing section 303.

Figure 21:
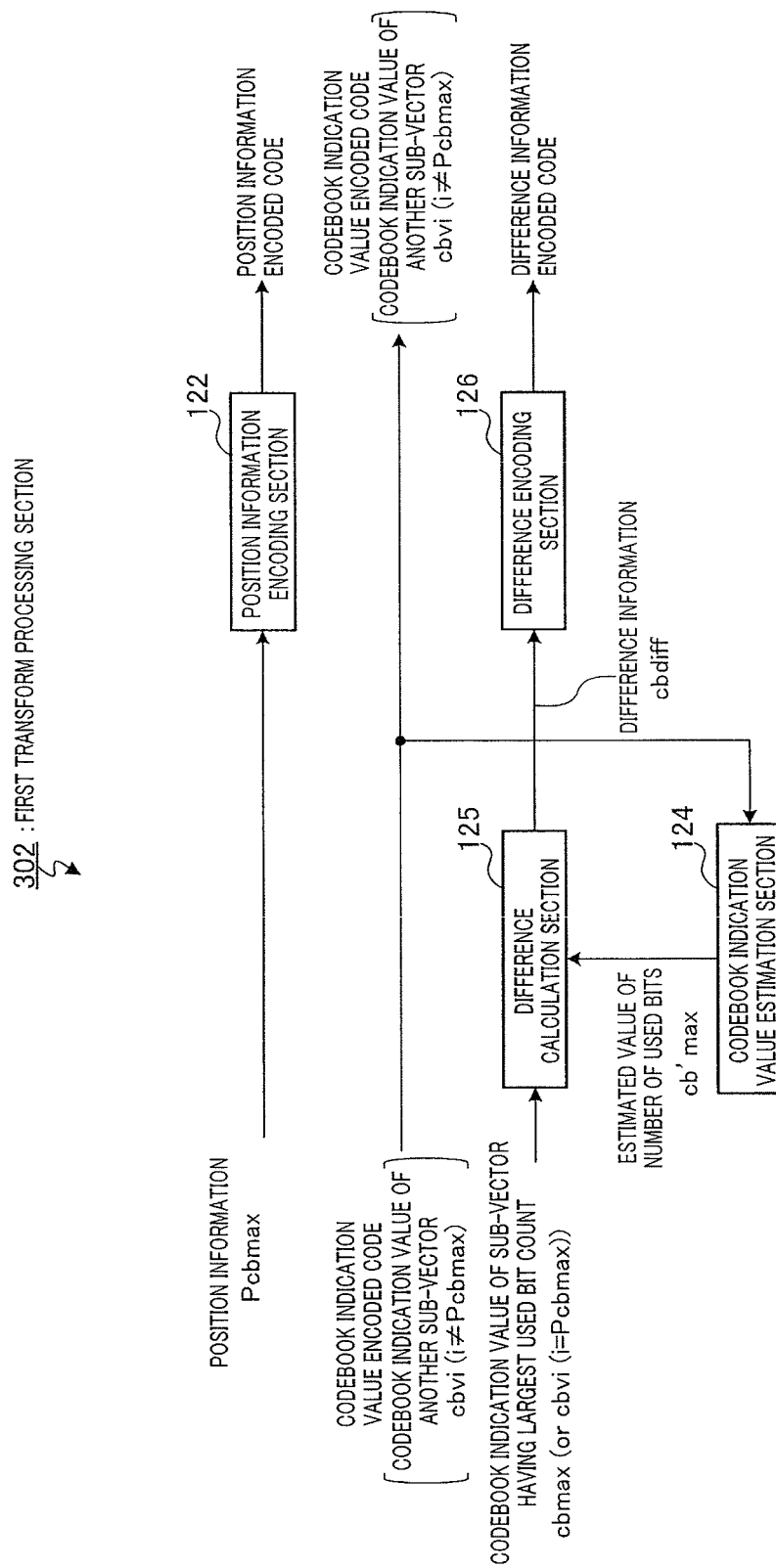
FIG. 21 is a block diagram illustrating an internal configuration of the first transform processing section illustrated in FIG. 20.

When connected with determination section 301, first transform processing section 302 receives the input of position information Pcbmax, codebook indication value cbmax (or cbvi (i=Pcbmax)) of the sub-vector having the largest used bit count, and codebook indication values cbvi (i≠Pcbmax) of other N−1 sub-vectors than the sub-vector having the largest used bit count, and generates and outputs position information encoded code, codebook indication value encoded code, and difference information encoded code. FIG. 21 illustrates an internal configuration of first transform processing section 302. Since components in FIG. 21 having the same reference numerals as in FIG. 12 are identical to those in FIG. 12, duplicate descriptions thereof will be omitted.

Figure 22:
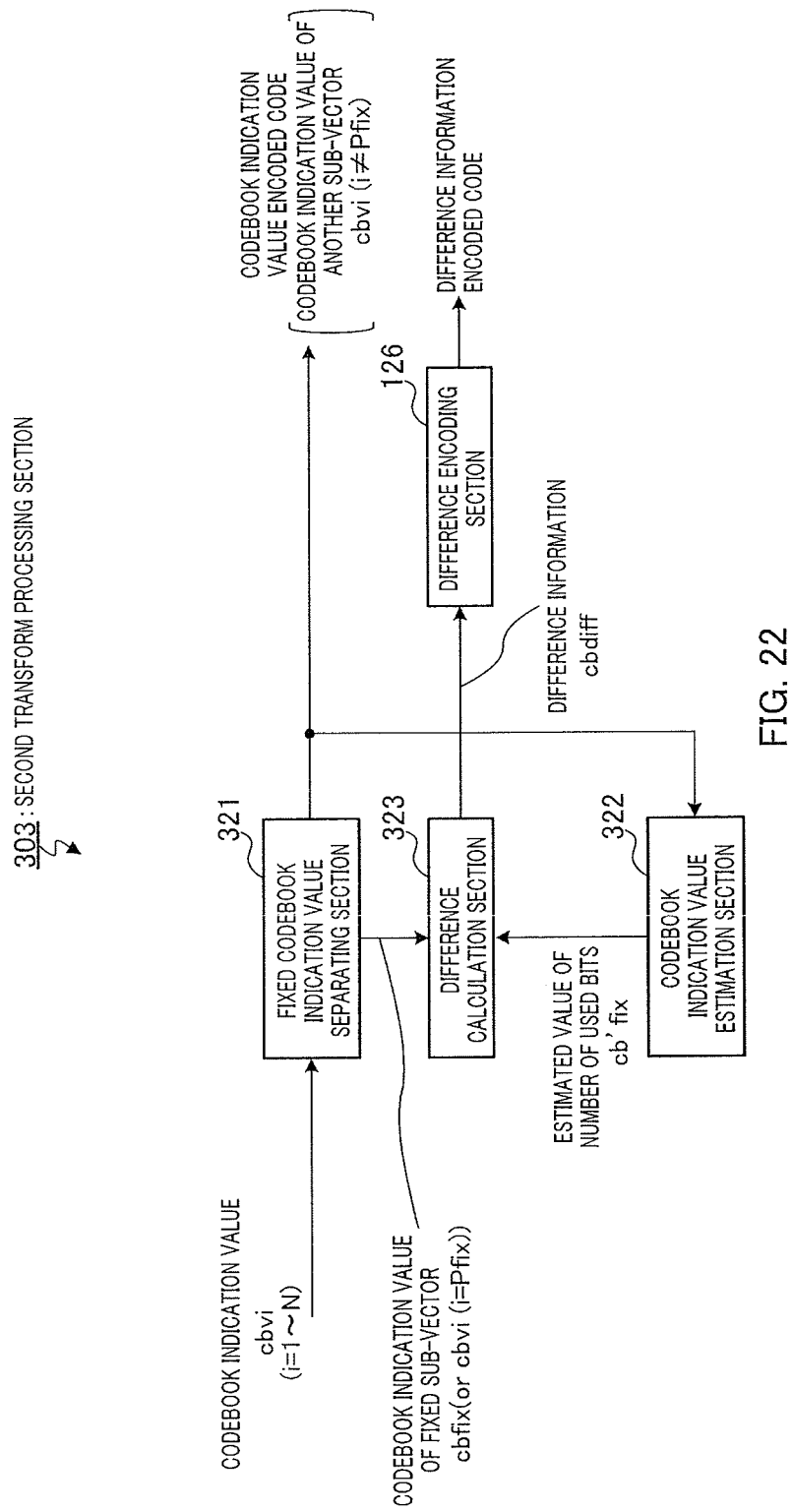
FIG. 22 is a block diagram illustrating an internal configuration of the second transform processing section illustrated in FIG. 20.

Referring back to FIG. 20, when connected with determination section 301, second transform processing section 303 receives the input of N codebook indication values cbvi (i=1 to N) and generates and outputs codebook indication value encoded code and difference information encoded code. FIG. 22 illustrates an internal configuration of second transform processing section 303. Since components in FIG. 22 having the same reference numerals as in FIG. 12 are identical to those in FIG. 12, duplicate descriptions thereof will be omitted.

In FIG. 22, fixed codebook indication value separating section 321 separates the inputted N codebook indication values cbvi (i=1 to N) into codebook indication value cbfix (or cbvi (i=Pfix)) of a sub-vector of predetermined position Pfix and codebook indication values cbvi (i≠Pfix) of the other N−1 sub-vectors, and outputs the former to difference calculation section 323. Then, fixed codebook indication value separating section 321 outputs the latter to codebook indication value estimation section 322, as well as outputting it as codebook indication value encoded code to multiplexing section 105.

Codebook indication value estimation section 322 calculates the estimated value of the number of used bits cb'fix of codebook indication value cbfix (or cbvi (i=Pfix)) of the sub-vector of position Pfix using codebook indication values cbvi (i≠Pfix) of the N−1 sub-vectors outputted from fixed codebook indication value separating section 321, according to the following equation 4, and outputs the calculated value to difference calculation section 323.

[4]

$$cb'fix = \left(Bits_{available} - \sum_{i \ne P_{fix}} Bits_{cbvi}\right)/5 \quad \text{(Equation 4)}$$

In equation 4, cb'fix denotes an estimated value of the number of used bits of a codebook indication value of a sub-vector of position Pfix, $Bits_{available}$ denotes a total number of available bits, and $Bits_{cbvi}$ denotes the number of used bits of a codebook indication value of sub-vector vi.

Difference calculation section 323 subtracts the estimated value of the number of used bits cb'fix outputted from codebook indication value estimation section 322 from codebook indication value cbfix (or cbvi (i=Pfix)) of the sub-vector of position Pfix outputted from fixed codebook indication value separating section 321 (cbfix−cb'fix) to calculate difference information cbdiff, and outputs the difference information cbdiff to difference encoding section 126.

Figure 23:
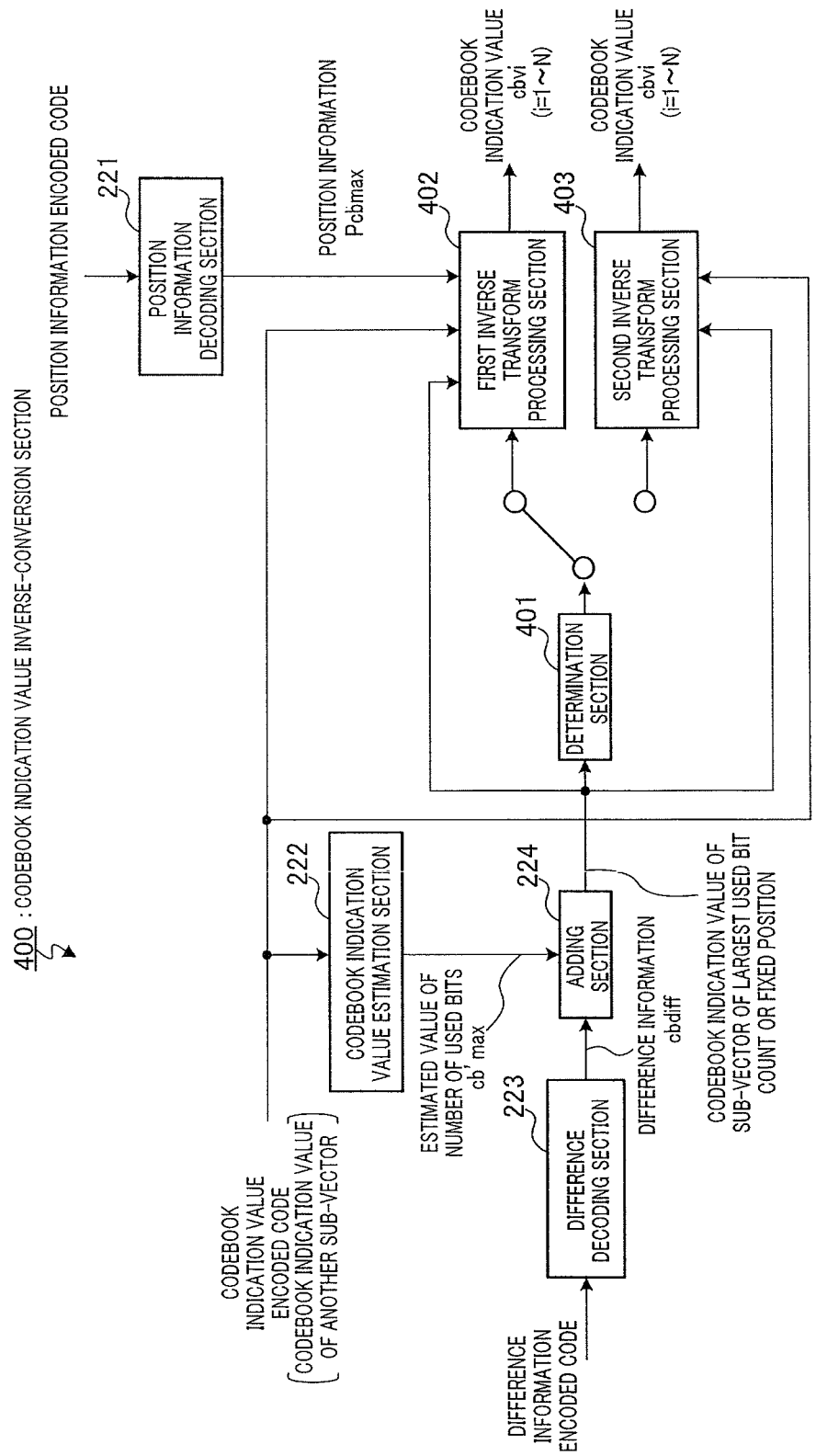
FIG. 23 is a block diagram illustrating an internal configuration of a codebook indication value inverse-conversion section according to Embodiment 2 of the present invention.

FIG. 23 is a block diagram illustrating an internal configuration of codebook indication value inverse-conversion section 400 according to Embodiment 2 of the present invention. FIG. 23 is different from FIG. 16 in determination section 401, first inverse transform processing section 402, and second inverse transform processing section 403.

The codebook indication value outputted from adding section 224 is inputted to determination section 401. This codebook indication value is a codebook indication value of either the sub-vector having the largest used bit count or the sub-vector in the predetermined fixed position. Determination section 401 compares the number of used bits of this codebook indication value with a prescribed threshold (identical to the threshold in the encoding apparatus). If the number of used bits of the codebook indication value is larger than the threshold as a result of the comparison, determination section 401 determines that the codebook indication value is the codebook indication value of the sub-vector having the largest used bit count, changes a switch to first inverse transform processing section 402, and connects with first inverse transform processing section 402. On the other hand, if the number of used bits of the codebook indication value is less than or equal to the threshold, determination section 401 determines that the codebook indication value is the codebook indication value of the sub-vector in the predetermined fixed position, changes a switch to second inverse transform processing section 403, and connects with second inverse transform processing section 403.

Figure 24:
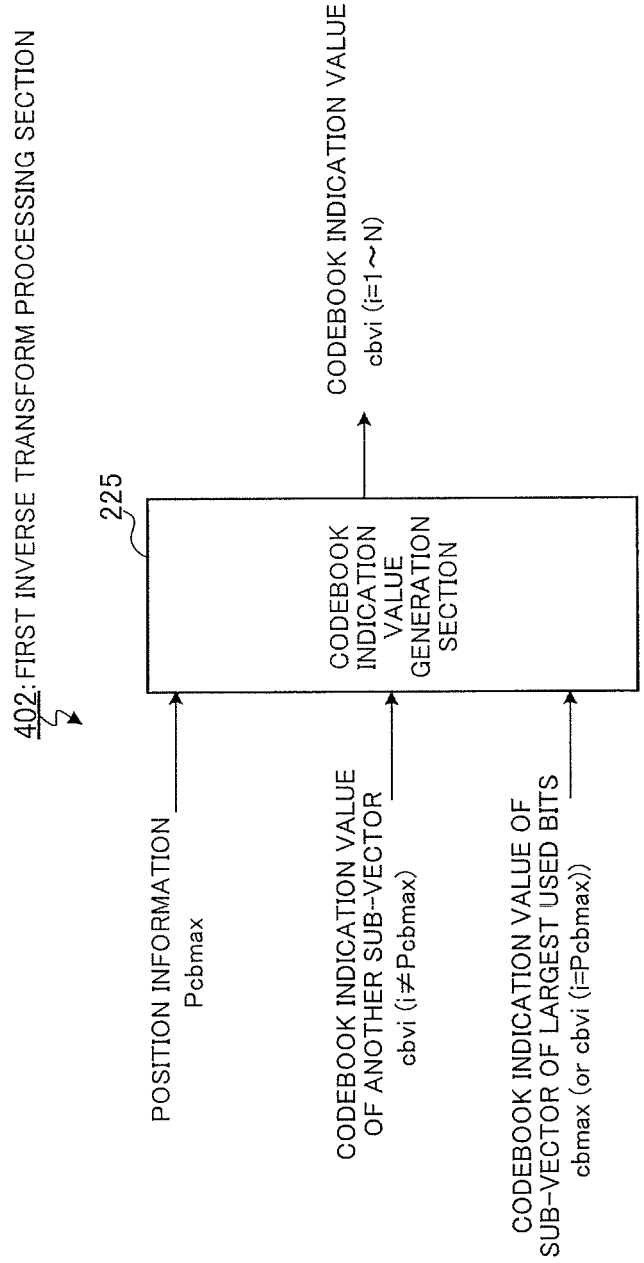
FIG. 24 is a block diagram illustrating an internal configuration of the first transform processing section illustrated in FIG. 23.

When connected with determination section 401, first inverse transform processing section 402 receives the input of position information Pcbmax, codebook indication value cbmax (or cbvi (i=Pcbmax)) of the sub-vector having the largest used bit count, and codebook indication values cbvi (i≠Pcbmax) of other N−1 sub-vectors than the sub-vector having the largest used bit count, and generates and outputs N codebook indication values cbvi (i=1 to N) using these items of information. FIG. 24 illustrates an internal configuration of first inverse transform processing section 402. Since components in FIG. 24 having the same reference numerals as in FIG. 16 are identical to those in FIG. 16, duplicate descriptions thereof will be omitted.

Figure 25:
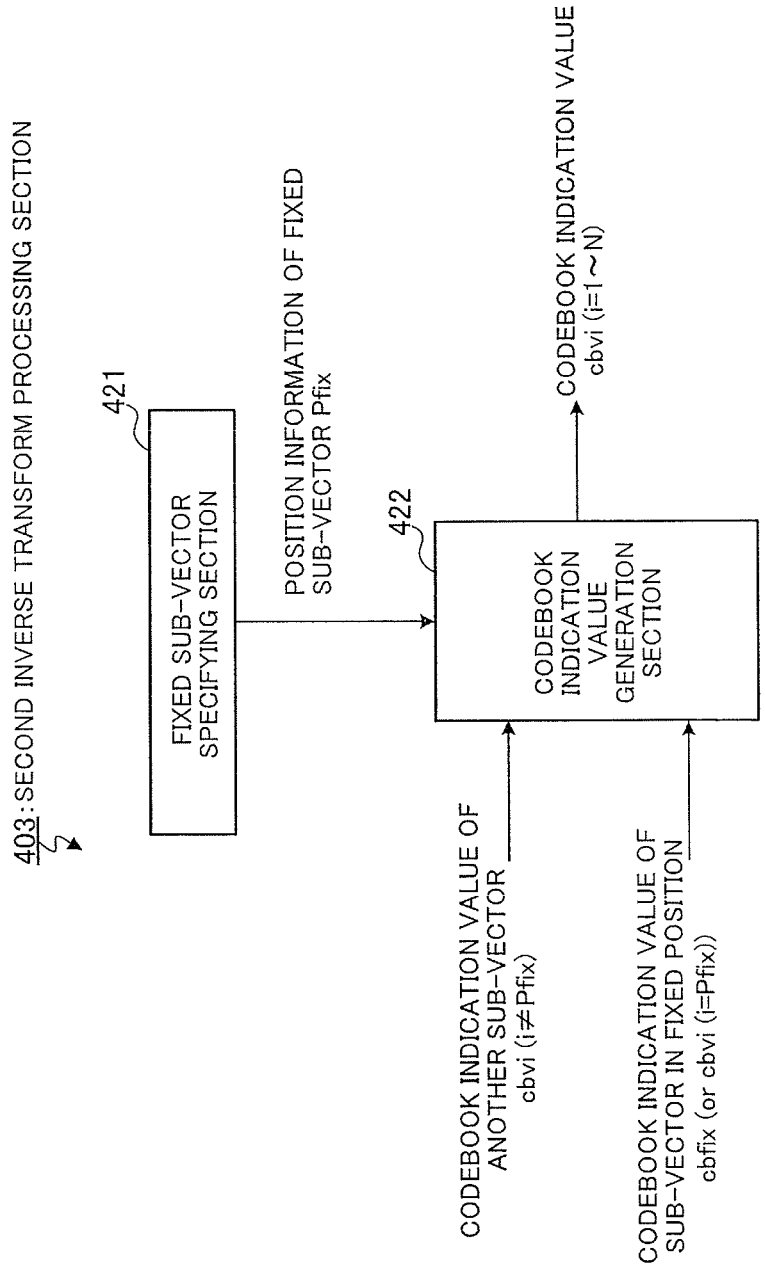
FIG. 25 is a block diagram illustrating an internal configuration of the second transform processing section illustrated in FIG. 23.

Referring back to FIG. 23, when connected with determination section 401, second inverse transform processing section 403 receives the input of codebook indication value cbfix (or cbvi (i=Pfix)) of the sub-vector in the predetermined fixed position and codebook indication values cbvi (i≠Pfix) of the other N−1 sub-vectors, and generates and outputs N codebook indication values cbvi (i=1 to N) using these items of information. FIG. 25 illustrates an internal configuration of second inverse transform processing section 403.

In FIG. 25, fixed sub-vector specifying section 421 outputs position information Pfix of a fixed sub-vector to codebook indication value generation section 422.

Codebook indication value generation section 422 generates and outputs N codebook indication values cbvi (i=1 to N) such that codebook indication value cbfix is positioned at position information Pfix, using codebook indication value cbfix (or cbvi (i=Pfix)) of the sub-vector in the predetermined fixed position, codebook indication values cbvi (i≠Pfix) of the other N−1 sub-vectors, and fixed position information Pfix.

As described above, according to Embodiment 2, in the case where the number of used bits of a codebook indication value having the largest used bit count is less than or equal to a prescribed threshold, the codebook indication value of a sub-vector at a previously fixed position is transformed to difference information between an actual number of bits and an estimated value of the number of used bits, and fixed position information is shared between the encoding apparatus and the decoding apparatus, so that position information can be omitted. Thereby, even if energy is not concentrated on any specific sub-vector, the number of used bits can be reduced.

In the present embodiment, a sub-vector in a fixed position may be determined according to a characteristic of an input spectrum. For example, if the codebook of the first (or last) sub-vector is statistically larger than those of the other sub-vectors, the first (or last) sub-vector may be selected. In short, it is just required to share fixed position information between the encoding apparatus and the decoding apparatus.

(Embodiment 3)

In the related art, codebook indication values are not designed depending on usage rates of codebooks, and the codebook list illustrated in FIG. 6 is widely used, simply.

However, statistics of usage of codebooks vary depending on conditions such as various bit rates and various numbers of sub-vectors. In NPL 7, some statistics about usage of each RE8 codebook are summarized in table 2C (statistic for each codebook number (usage rate %)).

According to this statistics information, it can be seen that the design of the codebook list of FIG. 6 is not efficient for the usage in NPL 7. Although the indication value of Q0 uses the least number of bits (1 bit), its usage rate is 3%, which is very low. Although the usage rate of Q2 is the highest (29%), its number of used bits is not the smallest.

Therefore, on a certain condition (the same bitrate, the same number of sub-vectors to be quantized), a codebook indication value may be assigned the number of bits depending on the usage probability of each codebook. Particularly, it is desirable that codebook indication values are designed using a Huffman table design technique in which a codebook with a high usage rate is assigned a less number of bits and a codebook with a low usage rate is assigned a more number of bits.

(Embodiment 4)

In Embodiment 4 of the present invention, a description will be given of cases where the bits reduced by Embodiment 1 are utilized for improving the accuracy of gain of quantized vectors.

In the present embodiment, by dividing a spectrum into smaller bands and assigning "gain correction coefficients" to the bands, bits reduced by the codebook indication value conversion method described in Embodiment 1 can be used for providing global gain with higher resolution. Because gain correction coefficients are sent utilizing reduced bits, the quantization performance can be improved and thus the sound quality can be improved.

Further, in the present embodiment, the codebook indication value conversion method described in Embodiment 1 can be applied to encoding of stereo or multi-channel signals. For example, the codebook indication value conversion method is applied to encoding of a sub-signal, and reduced bits are utilized for encoding of a main signal. This improves the subjective quality since the main signal is more perceptually important than the sub signal.

Further, in the present embodiment, the codebook indication value conversion method described in Embodiment 1 can be applied to a codec that encodes a spectrum coefficient sequence on multiple frames basis (or multiple sub-frame basis). In this case, reduced bits can be accumulated and utilized for encoding a spectrum coefficient sequence or other type of parameter sequence in the next encoding stage.

Further, in the present embodiment, bits reduced by the codebook indication value conversion method described in Embodiment 1 can be utilized for FEC (Frame Erasure Concealment) so that the sound quality can be kept in a frame loss situation.

Although split multi-rate lattice VQ is used in the description of the foregoing embodiments, the present invention is not limited to this method, and other spectrum coefficient coding methods may be used. The present invention can be modified and applied by those skilled in the art without departing from the spirit of the present invention.

Further, although the method of estimating a codebook indication value for one sub-vector having the largest used bit count has been described in the foregoing embodiments, the present invention is not limited to this method, and can be applied also to a configuration in which codebook indication values of a plurality of sub-vectors are estimated.

For example, in a case where the present invention is applied to sub-vectors corresponding to the top N of the numbers of used bits of codebook indication values, the respective pieces of position information of the corresponding N sub-vectors are transmitted to the decoding apparatus, and the number of used bits of other sub-vectors than the N sub-vectors is subtracted from a total number of available bits, and thus obtained value is divided by N to obtain a value to be used as an estimated value of the number of used bits of codebook indication values of the N sub-vectors. This estimated value of the number of used bits is calculated by equation 5 as follows:

[5]

$$cb'\max = \left(Bits_{available} - \sum_{i \notin S_N} Bits_{cbvi}\right) \Big/ (5 \cdot N) \quad \text{(Equation 5)}$$

In equation 5, cb'max denotes an estimated value of the number of used bits for sub-vectors corresponding to the top N of the numbers of used bits of codebook indication values, $Bits_{available}$ denotes a total number of available bits, $Bits_{cbvi}$ denotes the number of bits used for a codebook indication value of sub-vector vi, and SN denotes a set that represents the sub-vectors corresponding to the top N of the numbers of used bits of codebook indication values.

The encoding apparatus subtracts estimated value of the number of used bits cb'max calculated by equation 5 from the actual value for the top N sub-vectors' codebook indication values, and encodes such difference information.

Instead of sending the position information of sub-vectors to the decoding apparatus, a codebook indication value may be estimated with respect to a plurality of sub-vectors at predetermined positions according to equation 5. In this case, it is not necessary to transmit the position information of sub-vectors to the decoding apparatus.

Although the embodiments have been described with examples where the present invention is configured by hardware, the present invention can also be implemented by software in concert with hardware.

Each function block employed in the description of the aforementioned embodiments may typically be implemented as an LSI constituted by an integrated circuit. These functional blocks may be individual chips or partially or totally contained on a single chip. "LSI" is adopted here but this may also be referred to as "IC," "system LSI," "super LSI," or "ultra LSI" depending on differing extents of integration.

Further, the method of circuit integration is not limited to LSI, and implementation using dedicated circuitry or general purpose processors is also possible. After LSI manufacture, utilization of a programmable FPGA (Field Programmable Gate Array) or a reconfigurable processor where connections and settings of circuit cells within an LSI can be reconfigured is also possible.

Further, if integrated circuit technology comes out to replace LSI as a result of the advancement of semiconductor technology or a technology derivative of semiconductor technology, it is naturally also possible to carry out function block integration using this technology. Application of biotechnology is also possible.

The disclosure of Japanese Patent Application No. 2011-237820, filed on Oct. 28, 2011, including the specification, drawings, and abstract, is incorporated herein by reference in its entirety.

INDUSTRIAL APPLICABILITY

The speech encoding apparatus, speech decoding apparatus, speech encoding method and speech decoding method according to the present invention can be applied to a radio communication terminal apparatus and a radio communication base station apparatus of a mobile communication system, a teleconference terminal apparatus, a video conference terminal apparatus, a VoIP (Voice over Internet Protocol) terminal apparatus, and the like.

REFERENCE SIGNS LIST

101 Time-frequency transform section
102 Psychoacoustic model analysis section

103 Split multi-rate lattice VQ section
104, 300 Codebook indication value conversion section
105 Multiplexing section
121 Sub-vector identifying section
122 Position information encoding section
123 Codebook indication value separating section
124, 222, 322 Codebook indication value estimation section
125, 323 Difference calculation section
126 Difference encoding section
201 Demultiplexing section
202, 400 Codebook indication value inverse-conversion section
203 Split multi-rate lattice inverse VQ section
204 Frequency-time transform section
221 Position information decoding section
223 Difference decoding section
224 Adding section
225, 422 Codebook indication value generation section
301, 401 Determination section
302 First transform processing section
303 Second transform processing section
321 Fixed codebook indication value separating section
402 First inverse transform processing section
403 Second inverse transform processing section
421 Fixed sub-vector specifying section

The invention claimed is:

1. A speech encoding apparatus, comprising:
a memory that stores instructions;
a processor that executes the instructions;
a time-frequency domain transformer that transforms a time domain input speech signal to a frequency domain signal;
a calculator; and
a parameter encoder,
wherein, when executed by the processor, the instructions cause the processor to perform operations comprising:
dividing the frequency domain signal into a plurality of sub-vectors and quantizing spectral coefficients of each of the resultant sub-vectors;
encoding codebook indication values of all of the sub-vectors, the codebook indication values being obtained by the quantization, the codebook indication values representing codebook numbers in which larger numbers are given according to an energy amount of the plurality of sub-vectors, wherein the larger the codebook numbers, the larger a number of bits are used by each of the codebook indication values;
identifying, of the entire band, a band of a sub-vector with a codebook indication value having a largest used bit count among all of the codebook indication values; and
estimating a number of bits used by the codebook indication value having the largest used bit count, based on a total number of bits available in transmission units of the input speech signal and a number of used bits of a codebook indication value other than the codebook indication value having the largest used bit count;
wherein the calculator calculates, with respect to a number of bits necessary for encoding a codebook indication value of the band, a difference between an actual value and an estimated value, the actual value being an actual number of used bits of the codebook indication value having the largest used bit count, which is obtained by encoding the codebook indication value having the largest used bit count, and the estimated value being the estimated number of used bits of the codebook indication value having the largest used bit count, and the estimated value is obtained as the number of bits obtained by subtracting the total number of bits required for encoding a codebook indication value, other than that of the band, from the total number of bits usable for a codebook indication value of the entire band; and
wherein the parameter encoder encodes the identified position information of the sub-vector and the calculated difference information.

2. The speech encoding apparatus according to claim 1, wherein the instructions further cause the processor to determine whether the identified position information of the sub-vector is to be encoded or not, depending on a result of comparison between the actual number of used bits of the codebook indication value having the largest used bit count and a prescribed threshold.

3. The speech encoding apparatus according to claim 2, wherein, when the actual number of used bits of the codebook indication value having the largest used bit count is larger than the threshold, the calculator calculates the difference between the actual value and the estimated value.

4. The speech encoding apparatus according to claim 2, wherein:
when the actual number of used bits of the codebook indication value having the largest used bit count is less than or equal to the threshold, the speech encoding apparatus estimates the number of bits used by a codebook indication value of a predetermined sub-vector based on the total number of bits available in transmission units of the input speech signal and the number of used bits of codebook indication value other than the codebook indication value of the predetermined sub-vector; and
the calculator calculates a difference between an actual value and an estimated value, the actual value being an actual number of used bits of the codebook indication value of the predetermined sub-vector, which is obtained by encoding the codebook indication value of the predetermined sub-vector, and the estimated value being the estimated number of used bits of the codebook indication value of the predetermined sub-vector.

5. The speech encoding apparatus according to claim 1, wherein the input speech signal includes a signal on one or more channels of stereo or multi-channel signals.

6. The speech encoding apparatus according to claim 1, wherein the input speech signal includes a spectrum coefficient sequence on multiple frames basis or multiple sub-frames basis.

7. A speech decoding apparatus, comprising:
a memory that stores instructions;
a processor that executes the instructions;
a receiver that acquires the encoded position information and difference information from the speech encoding apparatus according to claim 1, and decodes the encoded position information and difference information; and
a frequency-time transformer;
wherein, when executed by the processor, the instructions cause the processor to perform operations comprising:
acquiring an encoded codebook indication value other than the codebook indication value having the largest used bit count from the speech encoding apparatus, and decoding the encoded codebook indication value;
estimating a number of bits used by the codebook indication value having the largest used bit count based on the total number of bits available in transmission units of the input speech signal and the number of used bits of the codebook indication value other than the codebook indication value having the largest used bit count;

adding the estimated number of bits used by the codebook indication value having the largest used bit count and the decoded difference information to calculate a codebook indication value having the largest used bit count;

generating all codebook indication values using the decoded position information, the decoded codebook indication value other than the codebook indication value having the largest used bit count, and the calculated codebook indication value having the largest used bit count; and de-quantizing spectral coefficients of each of the sub-vectors using all the generated codebook indication values; and wherein the frequency-time transformer transforms the de-quantized spectral coefficients into time domain.

8. The speech decoding apparatus according to claim 7, wherein the speech decoding apparatus further determines whether all the codebook indication values are to be generated or not using the position information of the sub-vector of the calculated codebook indication value having the largest used bit count, depending on a result of comparison between the number of used bits of the calculated codebook indication value having the largest used bit count or a codebook indication value of a sub-vector at a previously fixed position and a prescribed threshold.

9. The speech decoding apparatus according to claim 8, wherein, when the number of used bits of the calculated codebook indication value having the largest used bit count or the codebook indication value of the sub-vector at the previously fixed position is larger than the threshold, the speech decoding apparatus generates all the codebook indication values using the position information of the sub-vector of the calculated codebook indication value having the largest used bit count.

10. The speech decoding apparatus according to claim 8, wherein the speech decoding apparatus further determines whether all the codebook indication values are to be generated or not using the position information of the sub-vector at the previously fixed position when the number of used bits of the calculated codebook indication value having the largest used bit count or the codebook indication value of the sub-vector at the previously fixed position is less than or equal to the threshold.

11. The speech decoding apparatus according to claim 8, wherein a decoded spectrum is divided into a prescribed number of sub-bands, and the resultant sub-bands are scaled by gain correction coefficients.

12. A speech encoding method, comprising:
transforming a time domain input speech signal to a frequency domain signal;
dividing the frequency domain signal into a plurality of sub-vectors and quantizing spectral coefficients of each of the divided sub-vectors;
encoding codebook indication values of all of the sub-vectors, the codebook indication values being obtained by the quantizing, the codebook indication values representing codebook numbers in which larger numbers are given according to an energy amount of the plurality of sub-vectors, wherein the larger the codebook numbers, the larger a number of bits are used by each of the codebook indication values;
identifying, of the entire band, a band of a sub-vector with a codebook indication value having a largest used bit count among all of the codebook indication values;
estimating a number of bits used by the codebook indication value having the largest used bit count based on a total number of bits available in transmission units of the input speech signal and a number of used bits of a codebook indication value other than the codebook indication value having the largest used bit count;
calculating, with respect to a number of bits necessary for encoding a codebook indication value of the band, a difference between an actual value and an estimated value, the actual value being an actual number of used bits of the codebook indication value having the largest used bit count, which is obtained by encoding the codebook indication value having the largest used bit count, and the estimated value being the estimated number of used bits of the codebook indication value having the largest used bit count, and the estimated value is obtained as the number of bits obtained by subtracting the total number of bits required for encoding a codebook indication value, other than that of the band, from the total number of bits usable for a codebook indication value of the entire band; and
encoding the identified position information of the sub-vector and the calculated difference information as parameters.

13. A speech decoding method comprising:
decoding the position information and the difference information encoded by the speech encoding method according to claim 12, as parameters;
decoding a codebook indication value which is encoded by the speech encoding method and which is other than the codebook indication value having the largest used bit count;
estimating a number of bits used by the codebook indication value having the largest used bit count based on a total number of bits available in transmission units of the input speech signal and the number of used bits of the codebook indication value other than the codebook indication value having the largest used bit count;
adding the estimated number of bits used by the codebook indication value having the largest used bit count and the decoded difference information to calculate a codebook indication value having the largest used bit count;
generating all codebook indication values using the decoded position information, the decoded codebook indication value other than the codebook indication value having the largest used bit count, and the calculated codebook indication value having the largest used bit count;
de-quantizing spectral coefficients of each of the sub-vectors using all the generated codebook indication values; and
transforming the de-quantized spectral coefficients into time domain.

* * * * *